(12) United States Patent
Jeon et al.

(10) Patent No.: US 11,637,231 B2
(45) Date of Patent: Apr. 25, 2023

(54) ORGANIC THERMOELECTRIC MATERIAL AND THERMOELECTRIC GENERATOR INCLUDING THE SAME

(71) Applicants: KOOKMIN UNIVERSITY INDUSTRY ACADEMY COOPERATION FOUNDATION, Seoul (KR); UNIST (Ulsan National Institute of Science and Technology), Ulsan (KR)

(72) Inventors: Ju-Won Jeon, Seoul (KR); Sung-Yeon Jang, Seoul (KR)

(73) Assignees: KOOKMIN UNIVERSITY INDUSTRY ACADEMY COOPERATION FOUNDATION, Seoul (KR); UNIST (Ulsan National Institute of Science and Technology), Ulsan (KR)

( * ) Notice: Subject to any disclaimer, the term of this patent is extended or adjusted under 35 U.S.C. 154(b) by 185 days.

(21) Appl. No.: 17/072,641

(22) Filed: Oct. 16, 2020

(65) Prior Publication Data

US 2021/0119100 A1   Apr. 22, 2021

(30) Foreign Application Priority Data

Oct. 18, 2019 (KR) .......................... 10-2019-0130277
Sep. 1, 2020 (KR) .......................... 10-2020-0111294

(51) Int. Cl.
*H01L 35/24* (2006.01)
*H01L 51/00* (2006.01)
*H01L 35/34* (2006.01)
*H01L 35/32* (2006.01)

(52) U.S. Cl.
CPC .............. *H01L 35/24* (2013.01); *H01L 35/32* (2013.01); *H01L 35/34* (2013.01); *H01L 51/004* (2013.01); *H01L 51/0035* (2013.01)

(58) Field of Classification Search
CPC ....................................................... H01L 35/24
See application file for complete search history.

(56) References Cited

U.S. PATENT DOCUMENTS

| 8,932,977 B2 * | 1/2015 | Dismukes | ................. C25B 1/55 |
| | | | 29/25.03 |
| 2013/0276851 A1 * | 10/2013 | Crispin | .................. H01L 37/00 |
| | | | 136/203 |

FOREIGN PATENT DOCUMENTS

| BR | 102019003067 A2 * | 9/2020 |
| JP | 2013-179130 A | 9/2013 |
| JP | 2015-79669 A | 4/2015 |

(Continued)

OTHER PUBLICATIONS

Machine translation of BR102019003067A2 (Year: 2020).*
Communication dated Aug. 30, 2021, issued by the Korean Patent Office in counterpart Korean Application No. 10-2020-0111294.

*Primary Examiner* — Ryan S Cannon
(74) *Attorney, Agent, or Firm* — Sughrue Mion, PLLC

(57) ABSTRACT

Disclosed are an organic thermoelectric material and a thermoelectric generator including the same. More particularly, the thermoelectric generator includes an ionically conductive active layer containing a polyanion including an anionic group and a counter cation in a repeat unit thereof; a conductive polymer; and a polyvalent crosslinking agent as a single molecule including a plurality of acid functional groups. First and second electrodes are disposed to be connected to the ionically conductive active layer.

15 Claims, 17 Drawing Sheets

(56) References Cited

FOREIGN PATENT DOCUMENTS

| JP | 2017214527 A | * | 12/2017 | | |
|----|--------------|---|---------|---|---|
| KR | 10-2017-0088127 A | | 8/2017 | | |
| KR | 2018007651 A | * | 1/2018 | ............. | H01L 35/12 |
| KR | 10-2019-0093578 A | | 8/2019 | | |

* cited by examiner

[FIG. 1A]
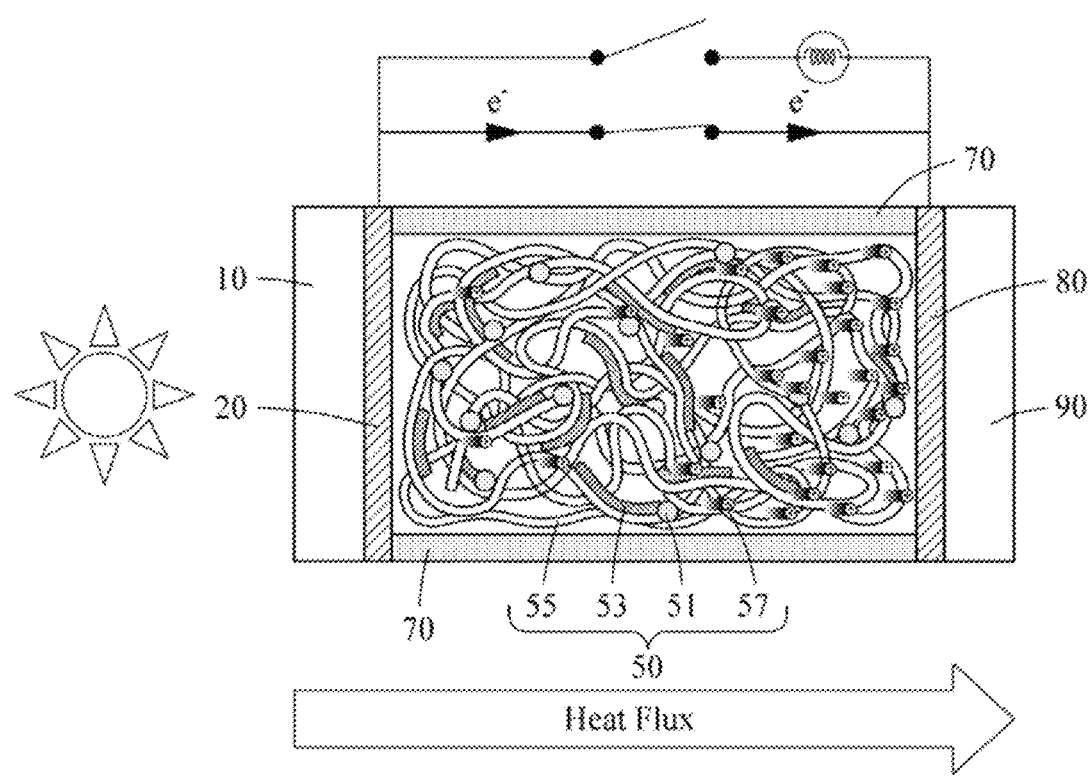

[FIG. 1B]
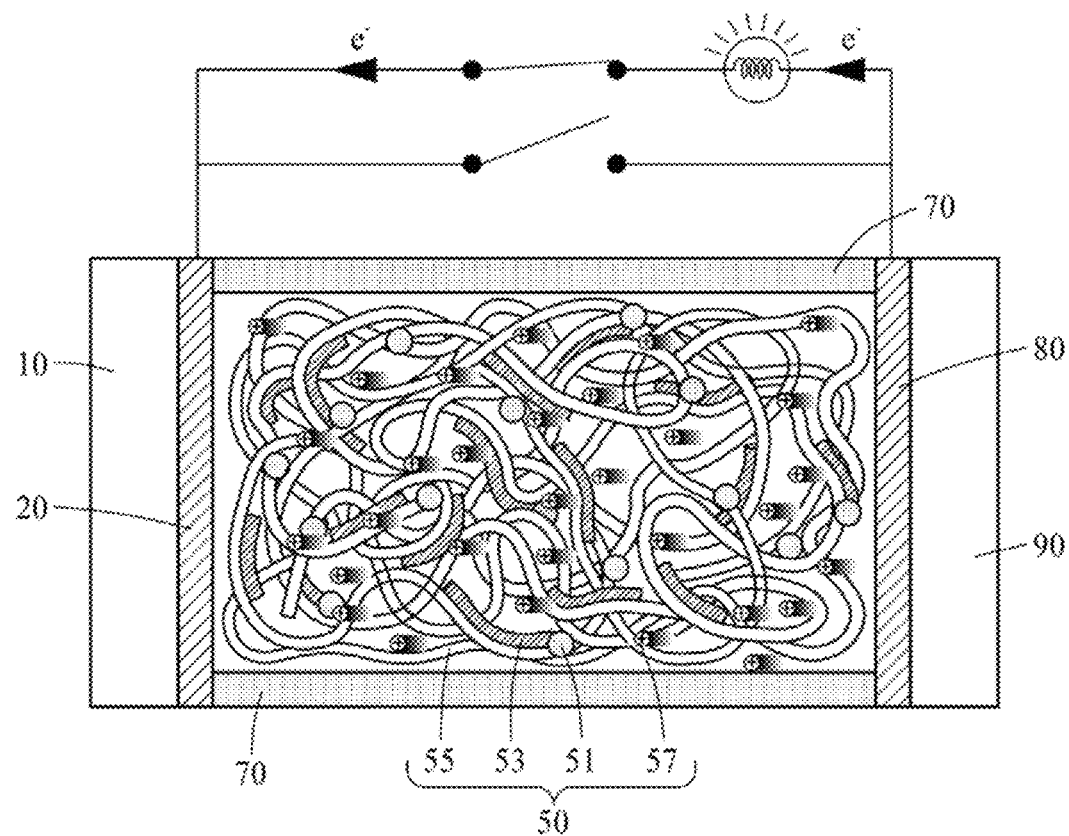

[FIG. 2]
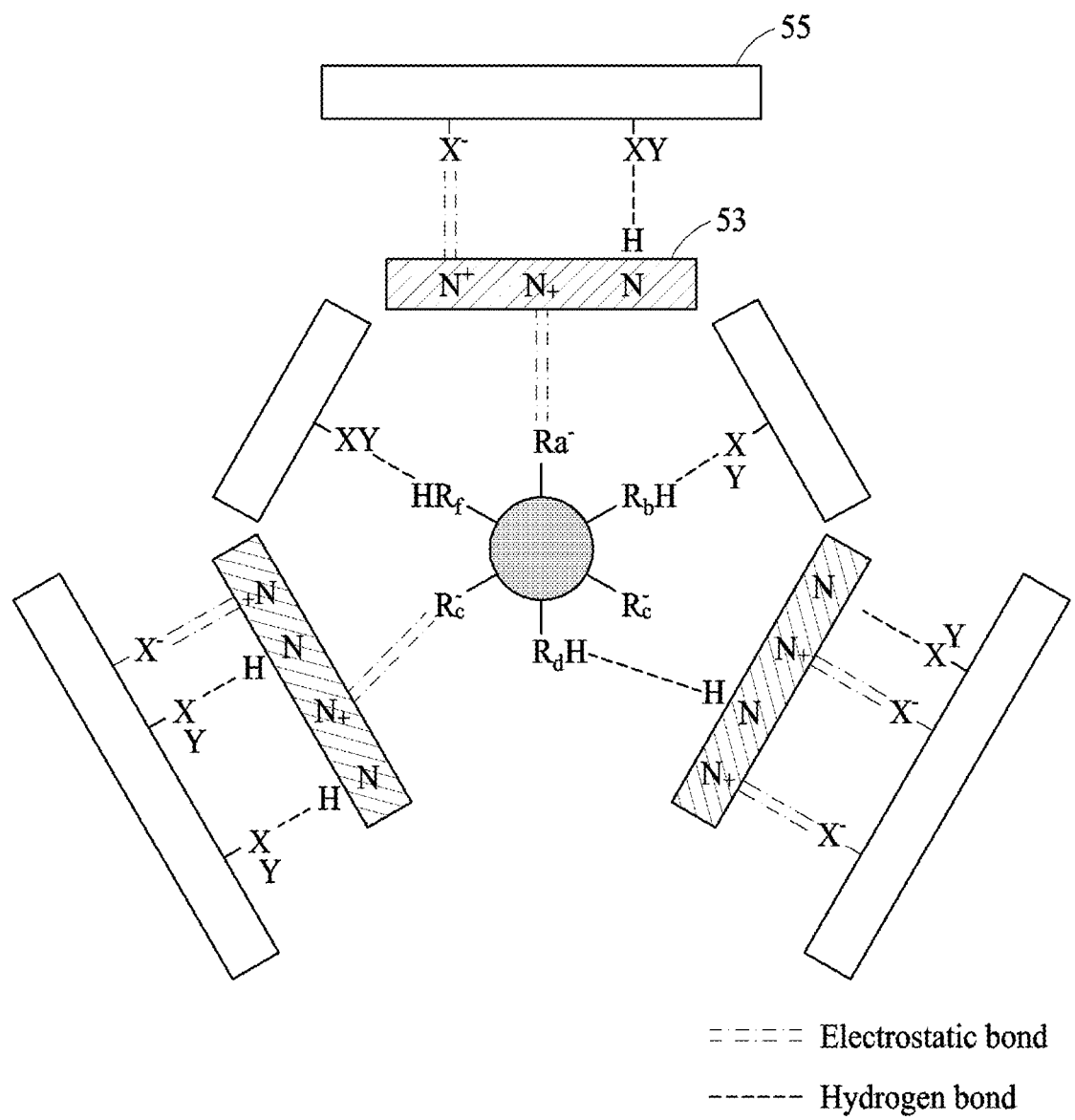

[FIG. 3]
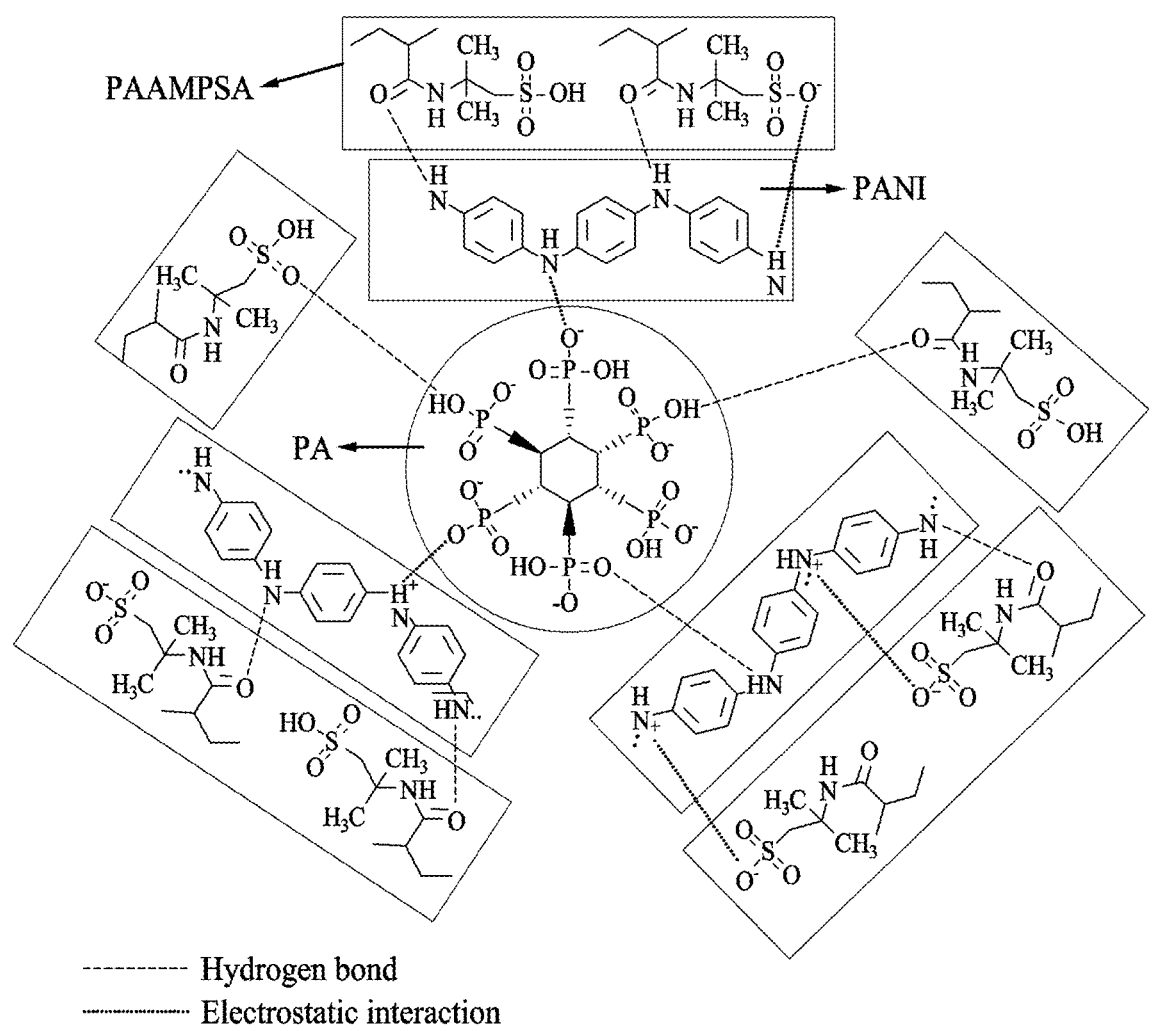
---- Hydrogen bond
······ Electrostatic interaction

[FIG. 4]
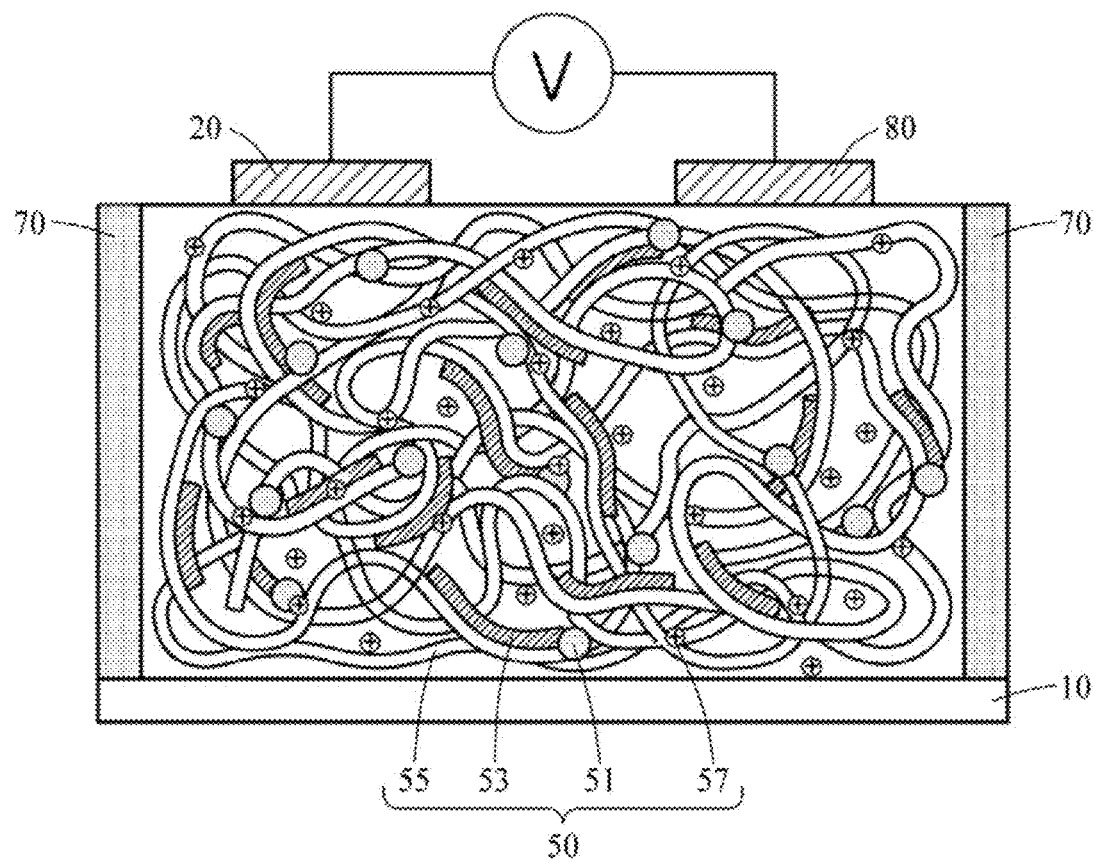

[FIG. 5]
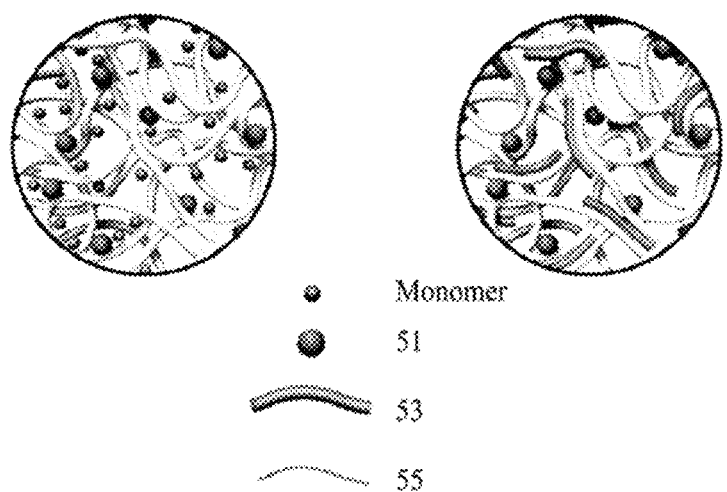
[FIG. 6]
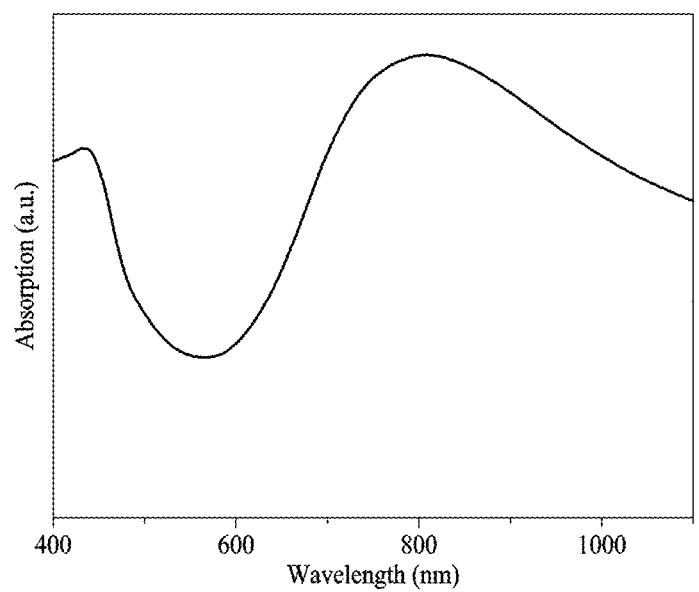

[FIG. 7A]
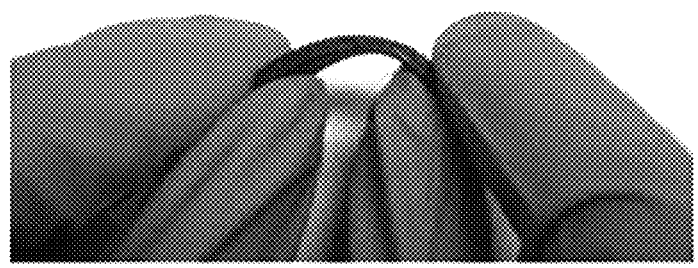
[FIG. 7B]
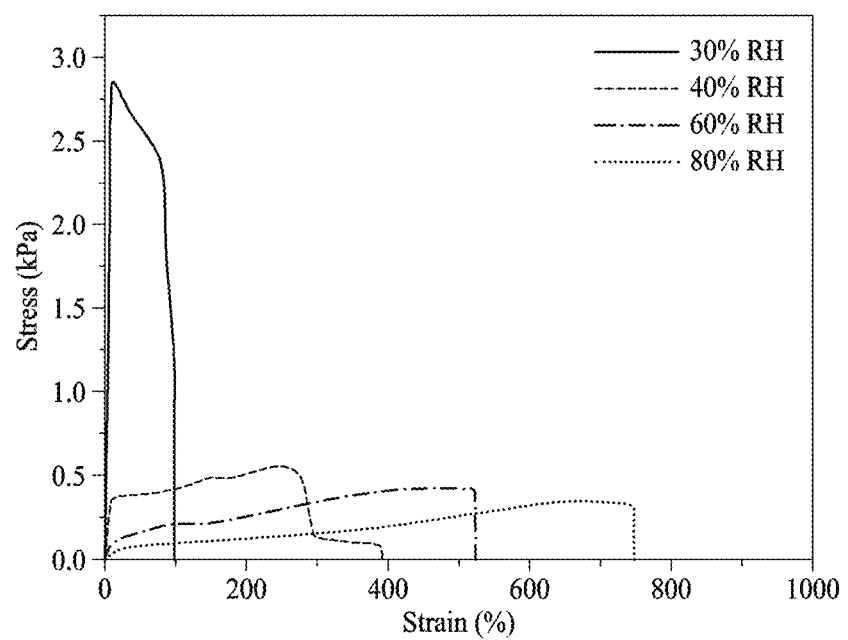

[FIG. 7C]
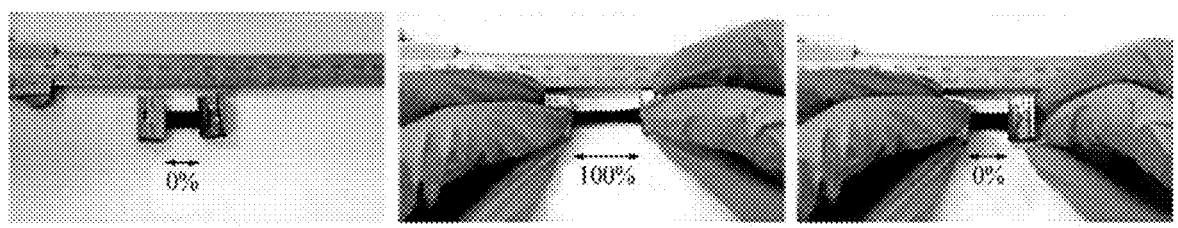
[FIG. 7D]
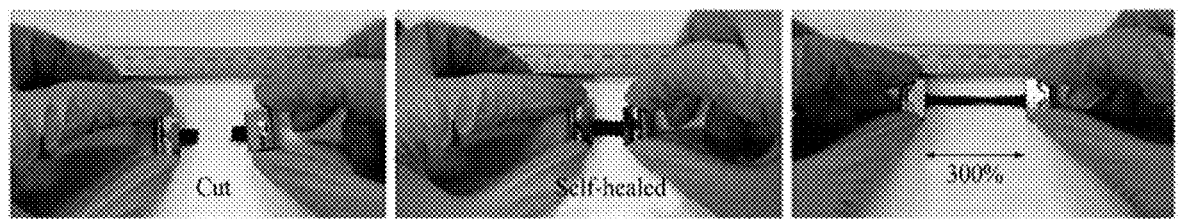

[FIG. 8]
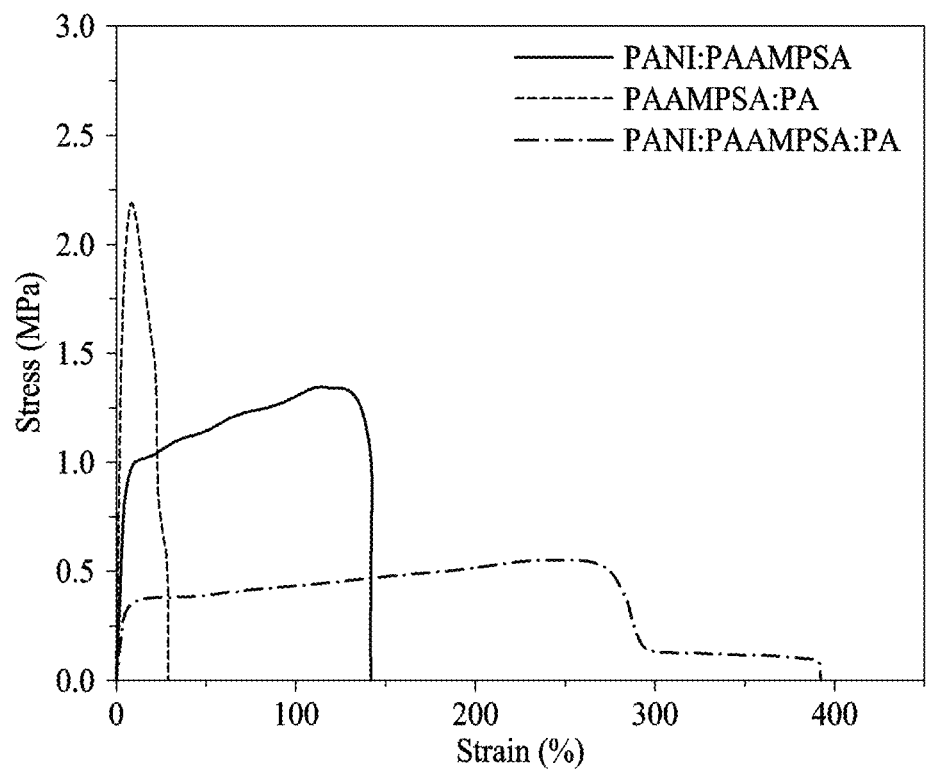
[FIG. 9]
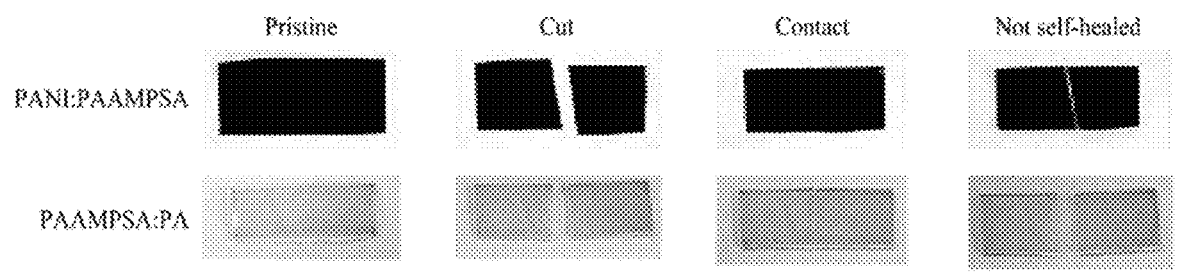

[FIG. 10]
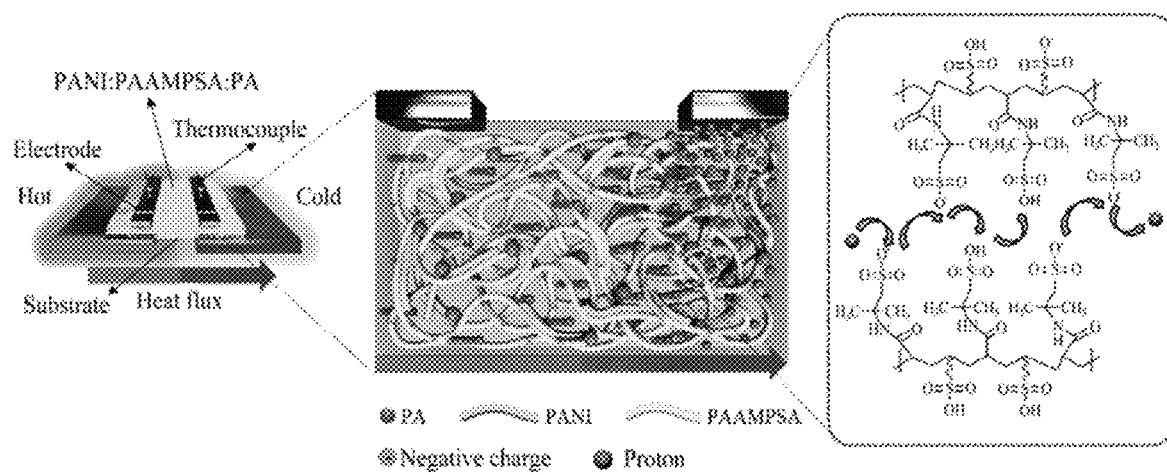
[FIG. 11A]
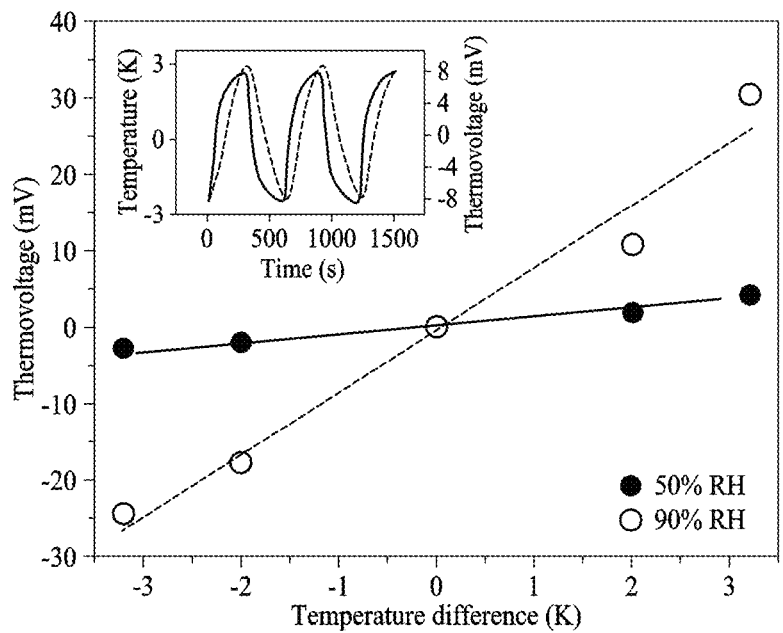

[FIG. 11B]
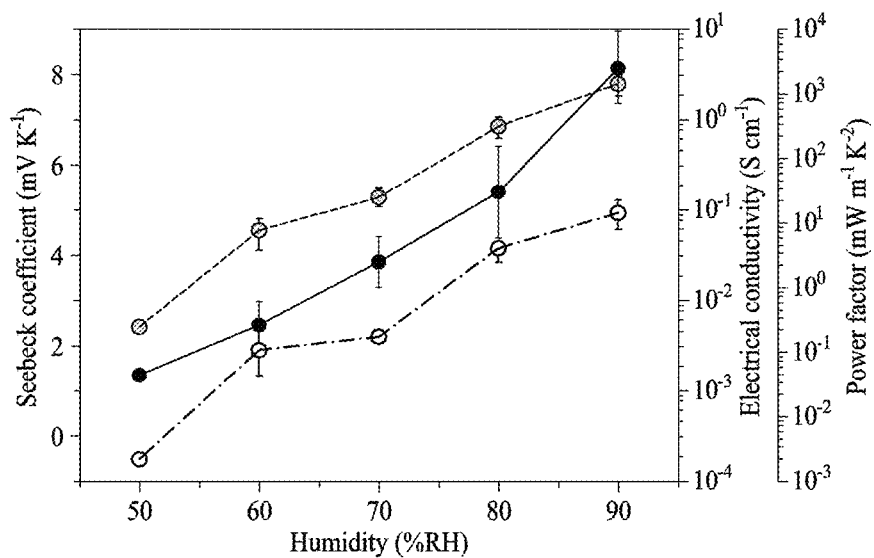
[FIG. 11C]
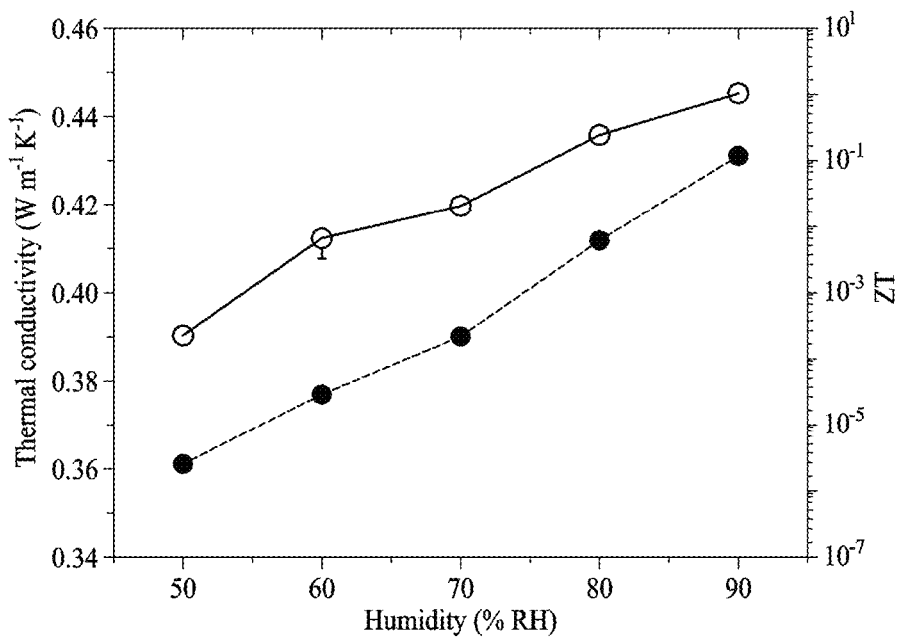

[FIG. 12A]
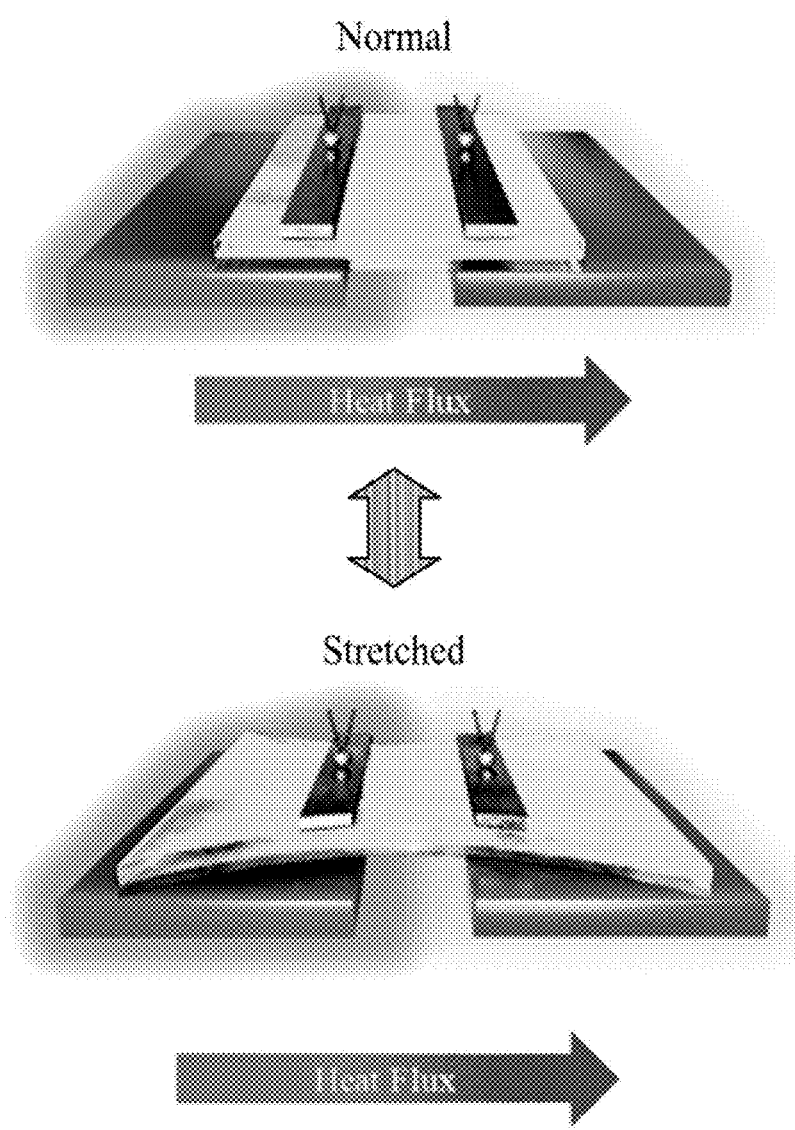

[FIG. 12B]
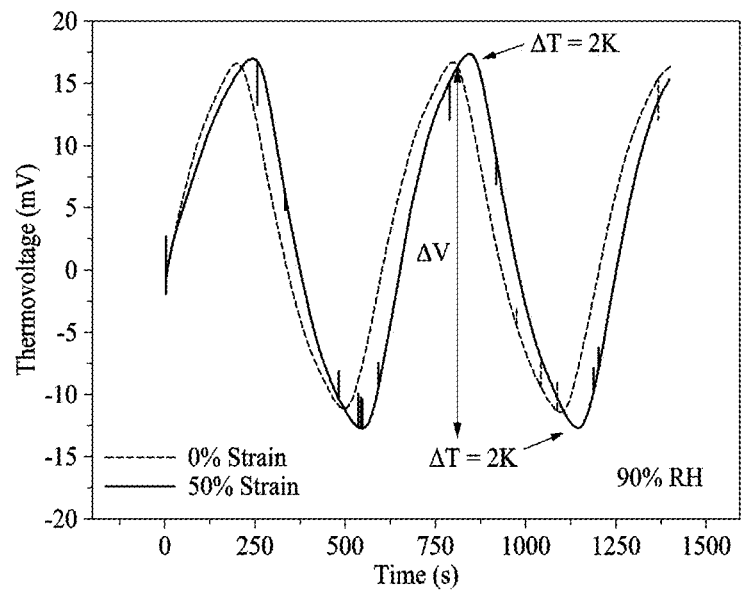
[FIG. 12C]
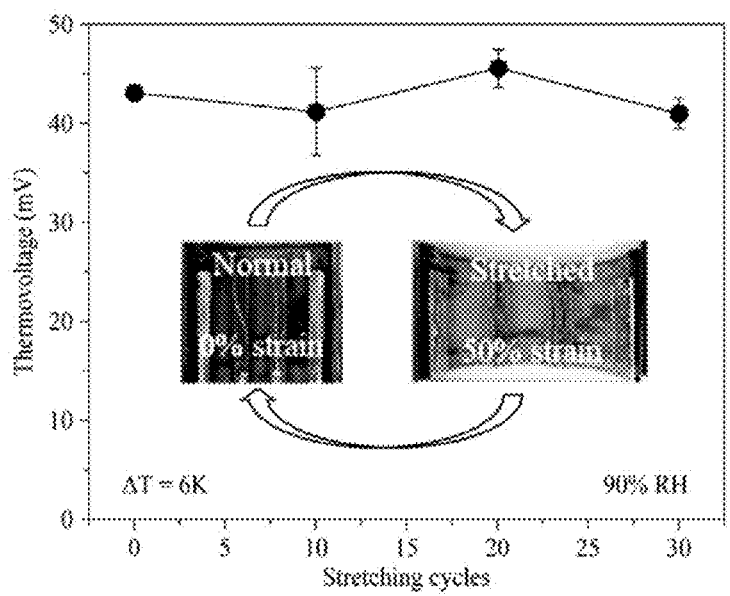

[FIG. 13A]
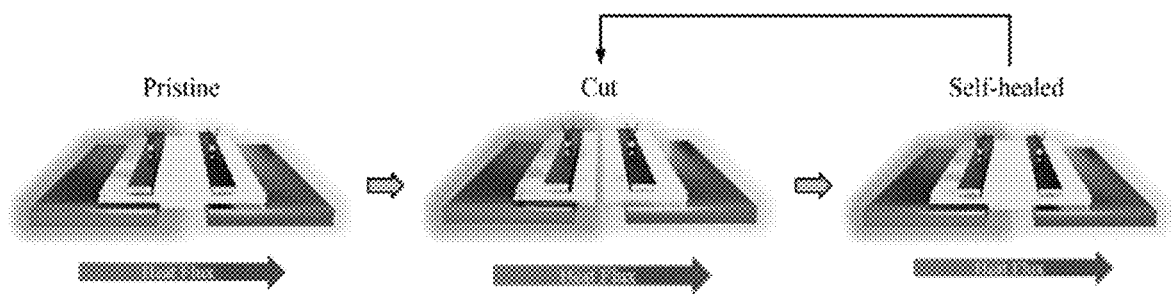
[FIG. 13B]
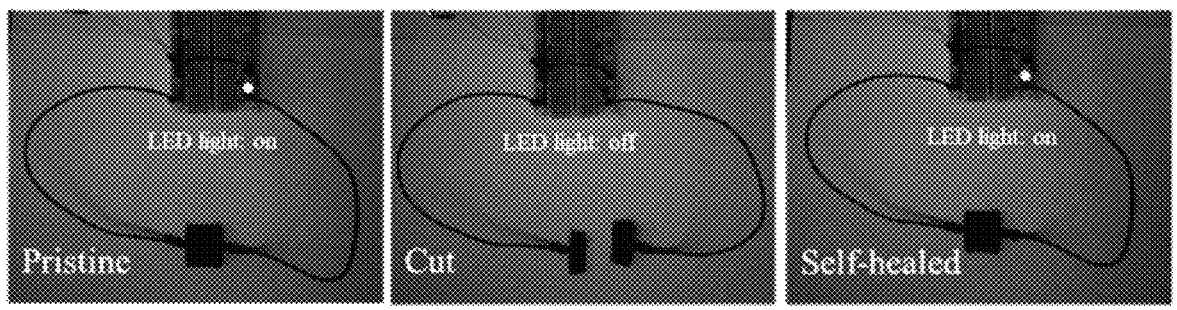

[FIG. 13C]
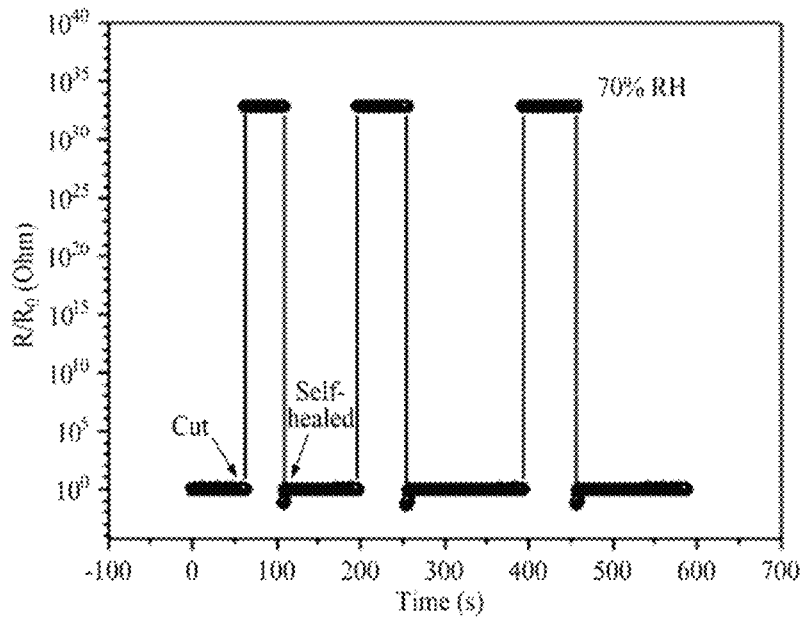
[FIG. 13D]
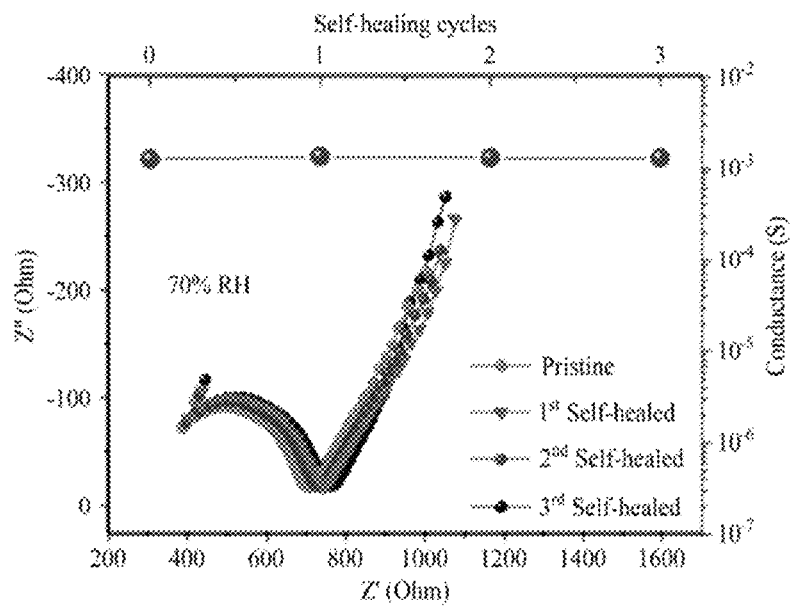

[FIG. 13E]
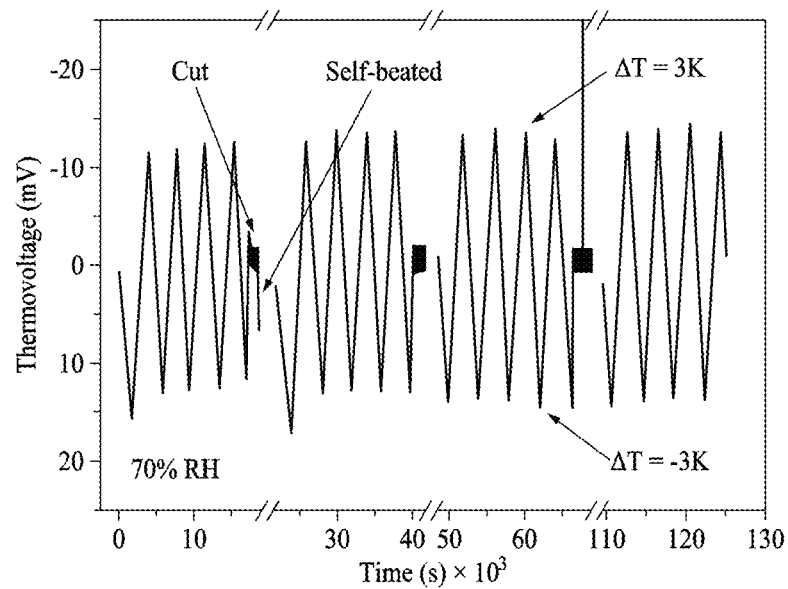
[FIG. 13F]
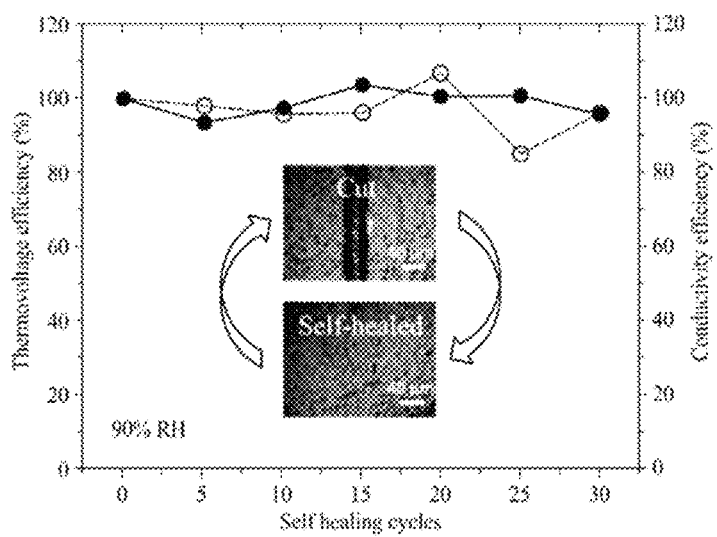

【FIG. 14】
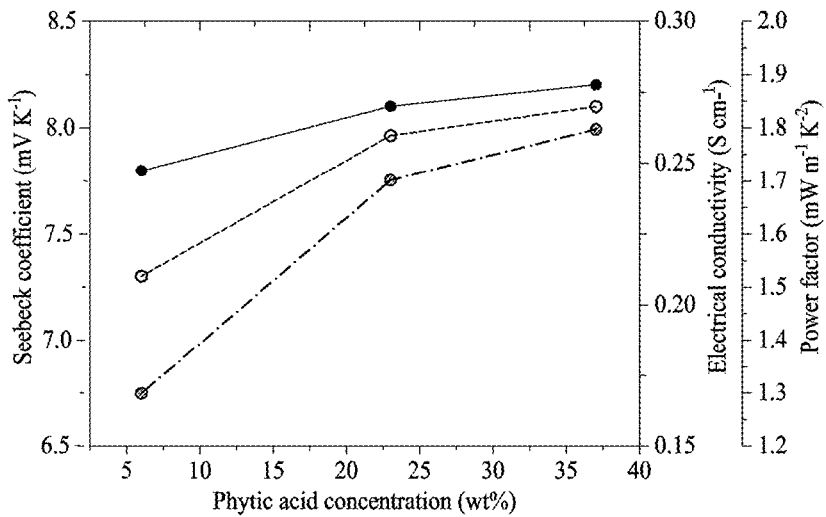
【FIG. 15】
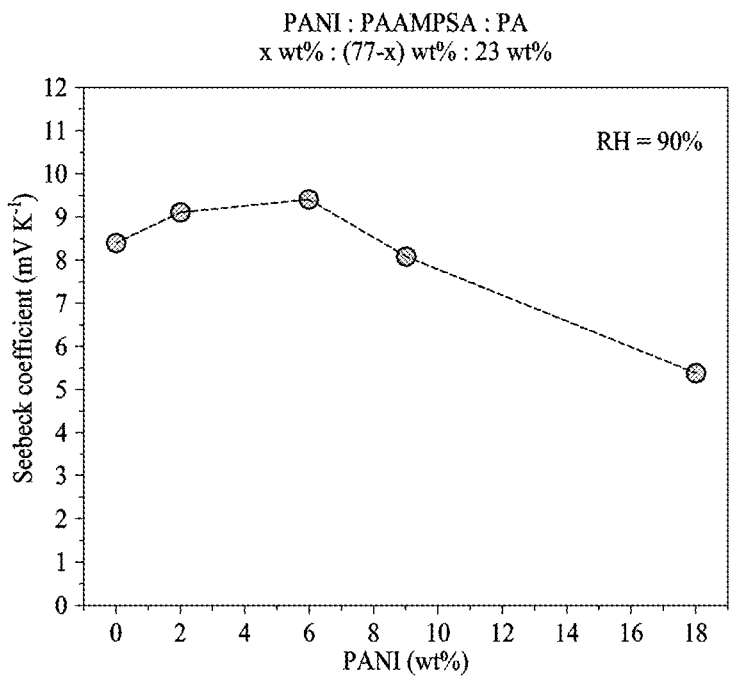

ORGANIC THERMOELECTRIC MATERIAL AND THERMOELECTRIC GENERATOR INCLUDING THE SAME

CROSS-REFERENCE TO RELATED APPLICATIONS

This application claims the priority benefit of Korean Patent Application No. 10-2019-0130277, filed on Oct. 18, 2019, and Korean Patent Application No. 10-2020-0111294, filed on Sep. 1, 2020, in the Korean Intellectual Property Office, the disclosure of each of which is incorporated herein by reference.

BACKGROUND OF THE DISCLOSURE

Field of the Disclosure

The present disclosure relates to a thermoelectric element, and more particularly to a thermoelectric generator.

Description of the Related Art

As examples of thermoelectric elements, there are a thermoelectric power generating device using the Seebeck effect that converts thermal energy into electrical energy, a cooling device using the Peltier effect that converts electrical energy into thermal energy, and the like. A thermoelectric element is a device and technology that best meet the demands of the times for energy saving. A thermoelectric device is widely used in industrial sites such as automobiles, aerospace, semiconductors, biotechnology, optics, computers, power generation, and home appliances.

Korean Patent Application Publication No. 2017-0049372 discloses a technology of imparting flexibility to a thermoelectric element. However, an inorganic semiconductor that does not have flexibility is used as a thermoelectric material in the literature, so that there is a limitation in exhibiting flexibility.

SUMMARY OF THE DISCLOSURE

Therefore, the present disclosure has been made in view of the above problems, and it is an object of the present disclosure to provide a thermoelectric material exhibiting excellent thermoelectric characteristics while having flexibility and a thermoelectric generator including the same.

It is another object of the present disclosure to provide a thermoelectric material having excellent elasticity and self-healing properties and a thermoelectric generator including the same.

In accordance with an aspect of the present disclosure, the above and other objects can be accomplished by the provision of a thermoelectric generator. The thermoelectric generator includes an ionically conductive active layer containing a polyanion including an anionic group and a counter cation in a repeat unit thereof; a conductive polymer; and a polyvalent crosslinking agent as a single molecule including a plurality of acid functional groups or basic functional groups. First and second electrodes are disposed or be connected to the ionic-conductive active layer.

The ionically conductive active layer may be a gel containing a liquid. The liquid may be a polar protic solvent. The polar protic solvent may be water. A dissociation constant of the polyvalent crosslinking agent having acid functional groups may be larger than a dissociation constant of the polyanion. The conductive polymer may be a conductive polymer having an amine group in a backbone thereof. The polyanion, the conductive polymer, and the polyvalent crosslinking agent may be crosslinked by a hydrogen bond and an electrostatic bond.

An anionic group of the polyanion may be $-O^-$, $-SO^{3-}$, $-OSO_3^-$, $-COO^-$, $-OPO_3^{2-}$, or $-PO_3^{2-}$, and a counter cation thereof is $H^+$, $Li^+$, $K^+$ or $Na^+$. A repeat unit of the polyanion may be represented by Formula 1A below:

[Formula 1A]

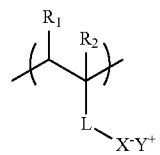

wherein $R_1$ and $R_2$ are each independently a hydrogen or a methyl group, L is a functional group including a bond (L is not bonding), $-CONH-$, $-COO-$, or phenylene, $X^-$ is $-O^-$, $-SO_3^-$, $-OSO_3^-$, $-COO^-$, $-OPO_3^{2-}$, or $-PO_3^{2-}$, and $Y^+$ is $H^+$, $Li^+$, $K^+$, or $Na^+$.

The repeat unit of the polyanion of Formula 1A may be represented by Formula 1B below:

[Formula 1B]

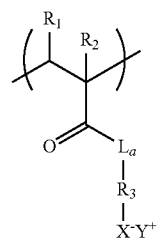

wherein $L_a$ is O or NH, $R_3$ is a C1 to C6 substituted or unsubstituted alkylene group, and $R_1$, $R_2$, $X^-$, and $Y^+$ are each the same as those defined in Formula 1A.

The polyanion may be poly(2-acrylamido-2-methyl-1-propanesulfoinc acid) (PAAMPSA).

The conductive polymer may be a polymer having an amine group ($-NH-$) in the backbone represented by Formula 2A or a polyaniline-based polymer having a repeat unit represented by Formula 2B:

[Formula 2A]

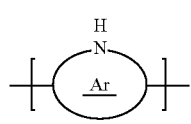

wherein Ar is 5- to 13-membered aromatic ring including N,

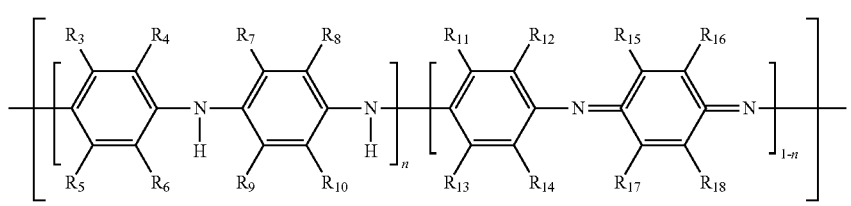

[Formula 2B]

wherein n is 0 to 1, and $R_3$ to $R_{18}$ are each independently hydrogen, C1 to C6 alkyl, C1 to C6 alkoxy, C1 to C6 haloalkyl, C1 to C6 haloalkoxy, F, Cl, Br, I, or CN. In some cases, $R_3$ and $R_4$, $R_5$ and $R_6$, $R_7$ and $R_8$, $R_9$ and $R_{10}$, $R_{11}$ and $R_{12}$, $R_{13}$ and $R_{14}$, $R_{15}$ and $R_{16}$, or $R_{17}$ and $R_{18}$ may form an aromatic ring fused to a benzene ring to which $R_3$ to $R_{18}$ are attached.

The polyvalent crosslinking agent may include 3 to 6 acid functional groups or basic functional groups, and the functional group may be carboxylic acid, sulfonic acid, amine or a phosphate group. The polyvalent crosslinking agent may be represented by Formula 3 below:

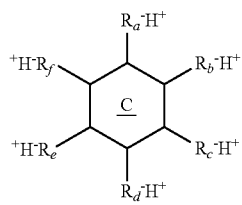

[Formula 3]

wherein ring C is a benzene ring, cyclohexane, or cyclohexene, and
$R_a$, $R_b$, $R_c$, $R_d$, $R_e$, and $R_f$ are each independently, hydrogen, carboxylic acid, sulfonic acid, or a phosphate group, and at least three of $R_a$, $R_b$, $R_c$, $R_d$, $R_e$, and $R_f$ are each independently carboxylic acid, sulfonic acid, or a phosphate group.

The polyvalent crosslinking agent may be phytic acid (PA).

The ionically conductive active layer may include 100 parts by weight of the polyanion, about 1 to 50 parts by weight of the conductive polymer, and about 1 to 80 parts by weight of the polyvalent crosslinking agent. Particularly, the polyvalent crosslinking agent may be included in an amount of 30 to 70 parts by weight, and the conductive polymer may be included in an amount of 1 to 15 parts by weight.

At least one of the electrodes may be a porous conductor. The thermoelectric generator may further include a spacer disposed on a surface of at least a portion of the ionically conductive active layer, wherein the spacer is a porous moisture adsorbent layer.

In accordance with another aspect of the present disclosure, there is provided a thermoelectric material. The thermoelectric material includes an ionically conductive active layer containing a polyanion including an anionic group and a counter cation in a repeat unit thereof; a conductive polymer including an amine group in a backbone thereof, and a polyvalent crosslinking agent as a single molecule having a plurality of acid functional groups, wherein the polyanion, the conductive polymer, and the polyvalent crosslinking agent are crosslinked by a hydrogen bond and an electrostatic bond.

In accordance with yet another aspect of the present disclosure, there is provided a method of manufacturing a thermoelectric material. First, a polyanionic aqueous solution containing a polyanion, a polyvalent crosslinking aqueous solution containing a polyvalent crosslinking agent, a monomer, and a polymerization initiator are mixed to obtain a mixture. The monomer is polymerized in the mixture to form a conductive polymer, thereby obtaining a water dispersion including the conductive polymer, the polyanion, and the polyvalent crosslinking agent. The polymerization initiator may be ammonium persulfate, potassium persulfate, sodium persulfate, copper chloride, or ferric chloride.

BRIEF DESCRIPTION OF THE DRAWINGS

The above and other objects, features and other advantages of the present disclosure will be more clearly understood from the following detailed description taken in conjunction with the accompanying drawings, in which:

FIGS. 1A and 1B schematically illustrate a thermoelectric generator according to an embodiment of the present disclosure and methods of operating the same;

FIG. 2 schematically illustrates physical interactions among a polyanion, a conductive polymer, and a polyvalent crosslinking agent;

FIG. 3 schematically illustrates physical interactions among PAAMPSA as a polyanion, PANI as a conductive polymer, and PA as a polyvalent crosslinking agent;

FIG. 4 schematically illustrates a thermoelectric generator according to another embodiment of the present disclosure;

FIG. 5 schematically illustrates a method of manufacturing an ionically conductive active layer according to an embodiment of the present disclosure;

FIG. 6 illustrates a UV-vis spectrum of a dispersion solution prepared according to Electrolyte Dispersion Solution Preparation Example 1;

FIGS. 7A to 7D illustrates a photograph (a), a stress-strain curve (b), tensile property test photographs (c), and self-healing property test photographs (d) of an electrolyte membrane prepared according to Electrolyte Membrane Preparation Example 1;

FIG. 8 illustrates stress-strain curves of electrolyte membranes according to Electrolyte Membrane Preparation Example 1, Electrolyte Membrane Comparative Example 1, and Electrolyte Membrane Comparative Example 3;

FIG. 9 illustrates self-healing properties of electrolyte membranes according to Electrolyte Membrane Comparative Example 1 and Electrolyte Membrane Comparative Example 3;

FIG. 10 schematically illustrates the thermoelectric power generation principle of a thermoelectric generator manufactured according to Thermoelectric Generator Manufacturing Example 1;

FIGS. 11A to 11C illustrates graphs (a) showing thermovoltages dependent upon temperature differences applied to a thermoelectric generator manufactured according to Thermoelectric Generator Manufacturing Example 1, graph (b) showing Seebeck coefficients, electrical conductivity, and power factors dependent upon relative humidity of the thermoelectric generator, and graphs (c) showing thermal conductivity and ZT dependent upon a relative humidity of the thermoelectric generator;

FIGS. 12A to 12C illustrates graphs (b) of thermovoltages when a thermoelectric generator (a) manufactured according to Thermoelectric Generator Manufacturing Example 1 in a non-deformed state or in a 50%-stretched state is temperature-changed in a temperature difference range of 4 K, and a thermovoltage graph (c) when a temperature difference of 6 K is applied the thermoelectric generator while repeatedly 50%-stretching the thermoelectric generator a total of 30 cycles;

FIGS. 13A to 13F illustrates self-healing properties of a thermoelectric generator of manufactured according to Thermoelectric Generator Manufacturing Example 1;

FIG. 14 illustrates Seebeck coefficients, electrical conductivity, and power factors of thermoelectric generators manufactured according to Thermoelectric Generator Manufacturing Examples 1 to 3 when a relative humidity is 90%; and FIG. 15 illustrates Seebeck coefficients of thermoelectric generators manufactured according to Thermoelectric Generator Manufacturing Examples 1 and 4 to 6 when a relative humidity is 90%.

DETAILED DESCRIPTION OF THE DISCLOSURE

Hereinafter, the present disclosure will be described in detail by describing exemplary embodiments of the disclosure with reference to the attached drawings. However, the scope of the present disclosure is not limited to the embodiments described in the present specification and may be embodied in other forms.

In the present specification, "substituted" means that at least one hydrogen in a group is substituted with deuterium, a halogen group, a C1 to C3 alkyl group, or a hydroxyl group, unless otherwise defined.

In the present specification, "alkyl group" or "alkylene group" refers to an aliphatic hydrocarbon group, unless otherwise defined. An alkyl group may be "saturated alkyl group" that does not include any double bonds or triple bonds. An alkyl group may be "unsaturated alkyl group" including at least one double or triple bond. An alkyl group may be branched, straight-chain or cyclic whether saturated or unsaturated.

In the present specification, "halo" refers to a halogen group and may be F, Cl, Br, or I. In addition, in the present specification, "Cx to Cy" should be construed as including carbon numbers corresponding to all integers between the carbon numbers, x and y. In addition, in the present specification, "X to Y" should be construed as including all integers between X and Y.

In the present specification, when a layer is formed "on" another layer or substrate, the layer may be directly formed on another layer or substrate or a third layer may be interposed therebetween.

FIGS. 1A and 1B schematically illustrate a thermoelectric generator according to an embodiment of the present disclosure and methods of operating the same.

Referring to FIG. 1A, the thermoelectric generator may include an ionically conductive active layer 50. The ionically conductive active layer 50 may include polyanions 55, a conductive polymer 53, and a polyvalent crosslinking agent 51.

The ionically conductive active layer 50 may be a solid or gel wherein a liquid is present among coiled chains of the polyanions 55. In an embodiment, the liquid may be a polar protic solvent. The polar protic solvent may be water. In this case, the gel may be hydrogel. The polar protic solvent may be an organic solvent, i.e., a polar protic organic solvent. In this case, the gel may be an organogel. The polar protic organic solvent may be alcohol, formic acid, or acetic acid. The alcohol may be an alkanol having 1 to 6 carbon atoms, for example, butanol, propanol, ethanol, or methanol. In another embodiment, the liquid may be an ionic liquid. In this case, the gel may be an ionogel. The ionic liquid is a salt in which a cation and an anion are bound by an ionic bond, and may refer to a material having fluidity in a liquid state at about 100° C. or less, particularly at room temperature.

The polyanions 55, which are a polymer wherein an anionic group and a counter cation are included in a repeat unit, may have an anionic group of $-O^-$, $-SO_3^-$, $-OSO_3^-$, $-COO^-$, $-OPO_3^{2-}$, or $-PO_3^{2-}$ and a counter cation of $H^+$, $Li^+$, $K^+$ or $Na^+$. A backbone of the polyanions 55 may be a saturated alkane or carbohydrate. A repeat unit of the polyanions 55 having a saturated alkane as a backbone may be represented by Formula 1A below.

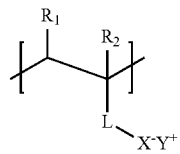

[Formula 1A]

In Formula 1A, $R_1$ and $R_2$ may be each independently a hydrogen or a methyl group, L may be a functional group including a bond (L is not bonding), $-CONH-$, $-COO-$, or phenylene, $X^-$ may be $-O^-$, $-SO_3^-$, $-OSO_3^-$, $-COO^-$, $-OPO_3^{2-}$, or $-PO_3^{2-}$, and $Y^+$ may be $H^+$, $Li^+$, $K^+$, or $Na^+$.

However, when $X^-$ is $-OPO_3^{2-}$, $X^-Y^+$ may be $-OPO_3H_2$ or

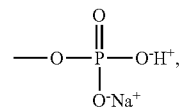

and when $X^-$ is $-PO_3^{2-}$, $X^-Y^+$ may be $-PO_3H_2$ or

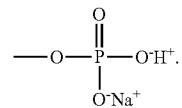

The repeat unit of the polyanions 55 represented by Formula 1A may be represented by, for example, Formula 1B below.

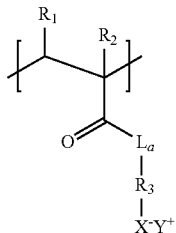

[Formula 1B]

In Formula 1B,
$L_a$ may be O or NH,
$R_3$ may be a C1 to C6 substituted or unsubstituted alkylene group, and
$R_1$, $R_2$, $X^-$, and $Y^+$ are each the same as those defined in Formula 1A.

The polyanions 55 represented by Formula 1A may be, particularly, polyvinylalcohol (PVA), where $R_1$ and $R_2$ are hydrogen, L is a bond, and $X^-Y^+$ is OH, polyacrylic acid, where $R_1$ and $R_2$ are hydrogen, L is a bond, and $X^-Y^+$ is COOH, polymethacrylic acid, where $R_1$ is hydrogen, $R_2$ is a methyl group, L is a bond, and $X^-Y^+$ is COOH, polystyrene sulfonate (PSS), where $R_1$ and $R_2$ are hydrogen, L is phenylene, and $X^-Y^+$ is $SO_3H$, poly(2-acrylamido-2-methyl-1-propanesulfoinc acid (PAAMPSA), where $R_1$ and $R_2$ are hydrogen, L is $-CONHC(CH_3)_2CH_2-$, and $X^-Y^+$ is $SO_3H$, (sulfooxy)ethyl methacrylate (2-(sulfooxy)ethyl methacrylate, where $R_1$ is hydrogen, $R_2$ is a methyl group, L is $-COOCH_2CH_2-$, $X^-Y^+$ is $-OSO_3H$), or sodium poly (vinyl phosphate), where $R_1$ and $R_2$ are hydrogen, L is a bond, and $X^-Y^+$ is

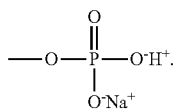

The polyanions 55 represented by Formula 1B may be, particularly, PAAMPSA, where $R_1$ and $R_2$ are hydrogen, La is $-NH-$, $R_3$ is $-C(CH_3)_2CH_2-$, and $X^-Y^+$ is $SO_3H$, or (sulfooxy)ethyl methacrylate, where $R_1$ is hydrogen, $R_2$ is a methyl group, La is $-O-$, $R_3$ is $-CH_2CH_2-$, and $X^-Y^+$ is $-OSO_3H$.

The polyanions 55 including carbohydrate as a backbone may be, particularly, carboxy methyl cellulose (CMC), agarose, or chitosan.

The conductive polymer 53, which is a conductive polymer including an amine group (—NH—) in a backbone thereof, may be polypyrrole, polycarbazole, or polyindole having the repeat unit represented by Formula 2A, a polyaniline-based polymer having the repeat unit represented by Formula 2B, or a combination thereof. Particularly, the conductive polymer 53 may be polyaniline (PANI). In particular, the conductive polymer 53 may be a polyaniline emeraldine base salt having the repeat unit represented by Formula 2B, where all $R_3$ to $R_{18}$ are a hydrogen and n is 0.5.

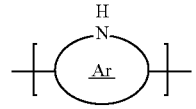

[Formula 2A]

In Formula 2A, Ar may be a 5- to 13-membered aromatic ring including N, for example, a 5-membered pyrrole, a 9-membered indole, or a 13-membered carbazole.

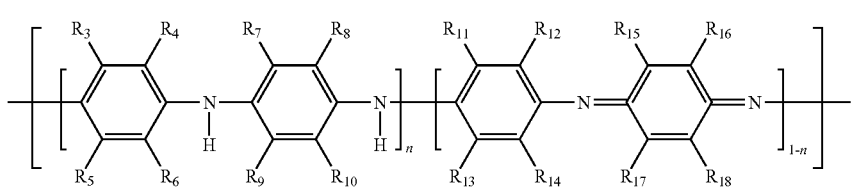

[Formula 2B]

In Formula 2B, n may be 0 to 1, for example, 0.4 to 0.6, and $R_3$ to $R_{18}$ may be each independently, hydrogen, C1 to C6 alkyl, C1 to C6 alkoxy, C1 to C6 haloalkyl, C1 to C6 haloalkoxy, F, Cl, Br, I, or CN. In some cases, $R_3$ and $R_4$, $R_5$ and $R_6$, $R_7$ and $R_8$, $R_9$ and $R_{10}$, $R_{11}$ and $R_{12}$, $R_{13}$ and $R_{14}$, $R_{15}$ and $R_{16}$, or $R_{17}$ and $R_{18}$ may form an aromatic ring fused to a benzene ring to which they are attached.

The polyvalent crosslinking agent 51 may include a plurality of acid functional groups or basic functional groups. For example, the polyvalent crosslinking agent 51 may be a single molecule including 3 or more, particularly 3 to 6, acid functional groups or basic functional groups. The acid functional group may be, particularly, carboxylic acid, sulfonic acid, or a phosphate group. The base functional group may be an amine.

When the polyvalent crosslinking agent 51 includes acid functional groups, the polyvalent crosslinking agent 51 may have a dissociation constant greater than that of the polyanions 55. The polyvalent crosslinking agent 51 may be aminopolycarboxylic acid or citric acid, or may be represented by Formula 3 below. An aminopolycarboxylic acid having 3 or more carboxylic acids may be 1,2-diaminopropane-N,N,N',N'-tetraacetic acid (PDTA), ethylenediaminetetraacetic acid (EDTA), methylglycinediacetic acid (MGDA), nitrilotriacetic acid (NTA), n-(2-carboxyethyl) iminodiacetic acid ((3-ADA), diethylenetriaminepentaacetic acid (DTPA), 1,4,7,10-tetraazacyclododecane-1,4,7,10-tetraacetic acid (DOTA), ethylenediamaine-N,N-dimalonic acid (EDDM), iminodisuccinic acid (ISA), ethylenediamine-N,N-disuccinic acid (EDDS), aspartic acid diethoxy succinate (AES) or a combination thereof.

[Formula 3]

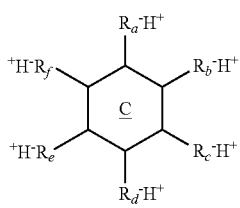

In Formula 3, ring C may be a benzene ring, cyclohexane, or cyclohexene, $R_a$, $R_b$, $R_c$, $R_d$, $R_e$, and $R_f$ may be each independently, hydrogen, carboxylic acid, sulfonic acid, or a phosphate group. Here, at least three of $R_a$, $R_b$, $R_c$, $R_d$, $R_e$, and $R_f$ may be each independently carboxylic acid, sulfonic acid, or a phosphate group.

The polyvalent crosslinking agent represented by Formula 3 may be benzene carboxylic acid, for example, hemimellitic acid, trimellitic acid, trimesic acid, prehnitic acid, mellophanic acid, pyromellitic acid, benzene pentacarboxylic acid, or mellitic acid shown below, or the like.

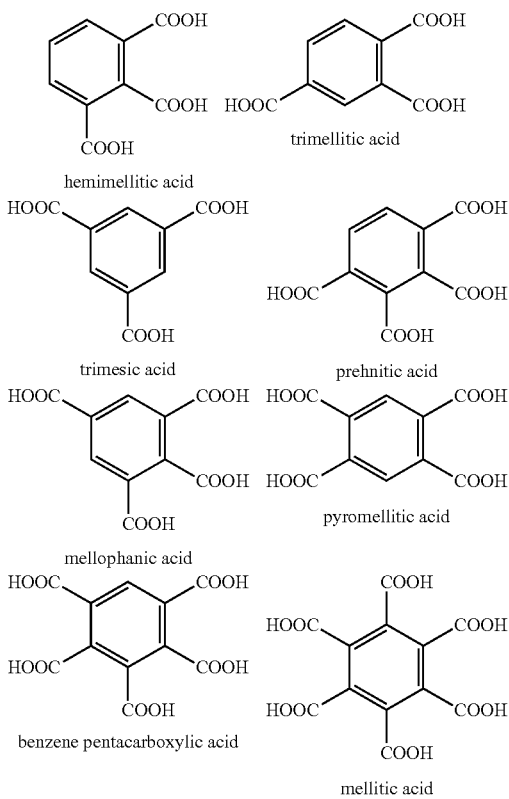

The polyvalent crosslinking agent represented by Formula 3 may be phytic acid (PA).

When the polyanions 55 are contained in an amount of 100 parts by weight in the ionically conductive active layer 50, the content of the conductive polymer 53 may be about 1 to 50 parts by weight and the polyvalent crosslinking agent 51 may be about 1 to 80 parts by weight.

Particularly, the conductive polymer 53 may be contained in an amount of about 1 to 15 parts by weight, more particularly in an amount of about 2 to 10 parts by weight, for example, about 2.5 to 9 parts by weight. Particularly, the polyvalent crosslinking agent 51 may be contained in an amount of 5 to 75 parts by weight, more particularly in an amount of about 25 to 70 parts by weight, for example, in an amount of about 30 to 67 parts by weight. Meanwhile, the ionically conductive active layer 50 may include a liquid. Here, the liquid may be included in an amount of 1 to 60 parts by weight. The liquid may be water, a polar protic organic solvent, or an ionic liquid as described above.

A first electrode 20 and a second electrode 80 may be disposed to be connected to the ionically conductive active layer 50. The ionically conductive active layer 50 may be disposed between a first substrate 10 and a second substrate 90, the first electrode 20 may be disposed between the first substrate 10 and the ionically conductive active layer 50, and the second electrode 80 may be disposed between the second substrate 90 and the ionically conductive active layer 50. Although the first and second electrodes 20 and 80 are illustrated as respectively disposed on facing side surfaces of the ionically conductive active layer 50, the present disclosure is not limited thereto. The first and second electrodes 20 and 80 may be disposed to be spaced apart from each other on one side surface, e.g. an upper surface, of the ionically conductive active layer 50 as shown in FIG. 2. In addition, the first substrate 10 and the second substrate 90 may be omitted. Spacers 70 may be disposed on at least portion of surfaces of the ionically conductive active layer 50 which is not covered with the electrodes 20 and 80 or the substrates 10 and 90.

The first electrode 20 and the second electrode 80 may be each independently a metal electrode, a metal oxide electrode, a conductive polymer electrode, or a porous conductor. The metal electrode may be silver or gold. The metal oxide electrode may be ruthenium oxide ($RuO_2$), cobalt oxide ($Co_3O_4$), manganese oxide ($MnO_2$), iron oxide ($Fe_3O_4$), or zinc oxide (ZnO). The conductive polymer electrode may be polythiophene, polyaniline, polypyrrole or a conductive polymer based thereon. The porous conductor may be activated carbon powder, carbon nanotube (CNT), graphite, carbon fiber, or a porous carbon electrode as a composite thereof.

The first substrate 10 and the second substrate 90 may be a glass or polymer substrate having excellent thermal conductivity. When the first and second substrates 10 and 90 are polymer substrates, there is an advantage that additional flexibility may be imparted to an element.

The spacers 70 play a role of suppressing outflow of moisture in the ionically conductive active layer 50 to the outside. Further, the spacers may be porous moisture adsorbent layers that absorb surrounding moisture and supply the same to the ionically conductive active layer 50. Particularly, the porous moisture adsorbent layer may be a zeolite layer or a metal-organic framework (MOF) layer.

Referring to FIGS. 1A and 1B again, the thermoelectric generator according to an embodiment of the present disclosure is described.

Cations 57 contained in the polyanions 55 diffuse from a high temperature to a low temperature due to the Soret effect when a temperature gradient occurs in the ionically conductive active layer 50, thereby causing a concentration gradient in the ionically conductive active layer 50. Particularly, the cations 57 may move while hopping between anionic groups (X−) of the polyanions 55. Here, the polyanions 55 may not move due to chain entanglement and interaction with the polyvalent crosslinking agent 51 and the conductive polymer 53.

In an embodiment, since a heat source is present near the first electrode 20 as shown in FIG. 1A, the cations 57 diffuse in the direction of the second electrode 80 when the temperature of the first electrode 20 is higher than that of the second electrode 80, so that the cations 57 may be present in a greater concentration near the second electrode 80 than near the first electrode 20. Particularly, in this case, electrons move from the first electrode 20 to the second electrode 80 through an external circuit so as to achieve electrical equilibrium so that the cations 57 of the ionically conductive active layer 50 and electrons of the second electrode 80 may generate an electrical double layer. Alternatively, electron charge transfer may occur between the first electrode 20 and the ionically conductive active layer 50. As a result, thermovoltage may be generated through an external circuit. Here, when at least the second electrode 80 is formed of a porous conductor having a large surface area, a metal oxide electrode or a conductive polymer electrode, a large amount of charge may be stored. The stored charge may be maintained for a certain period when all external circuits are disconnected. In other words, the thermoelectric generator according to an embodiment of the present disclosure may charge electricity using a temperature difference.

Meanwhile, ionic groups of the polyanions 55 may remain in an undissociated state when a dissociation constant of the polyvalent crosslinking agent 51 is larger than that of the polyanions 55, so that a larger concentration gradient of the cations 57 may occur in the ionically conductive active layer 50 when a temperature gradient occurs in the ionically conductive active layer 50. As a result, a ratio of thermovoltage to temperature change, i.e., the Seebeck coefficient or S value, may be improved. However, property improvement due to addition of the polyvalent crosslinking agent 51 may be saturated when the amount of the polyvalent crosslinking agent 51 is about 30 parts by weight or more based on 100 parts by weight of the polyanions 55.

In addition, when a temperature gradient occurs in the ionically conductive active layer 50, holes may move in the same direction as the cations 57 due to the Seebeck effect through a backbone of the conductive polymer 53. Here, when the amount of the conductive polymer 53 is about 1 to 15 parts by weight, particularly about 2 to 10 parts by weight, based on 100 parts by weight of the polyanions 55, excellent S value may be exhibited. Accordingly, the conductive polymer 53 may also contribute to generation of thermovoltage. However, as shown in the experimental examples described below, it was estimated that electricity generated in the thermoelectric generator according to the present disclosure was mainly caused by the Soret effect due to rather than the Seebeck effect.

In addition, the conductive polymer 53 may be doped with + due to anionic groups of the polyanions 55 and carboxylic acid, sulfonic acid, or a phosphate group of the polyvalent crosslinking agent 51. As a result, conductivity through the backbone of the conductive polymer 53 may be improved. In addition, when the ionically conductive active layer 50 is formed, a monomer for forming the conductive polymer 53 is added in an aqueous solution containing the polyanions 55 and the polyvalent crosslinking agent 51, and then the monomer is polymerized to form the conductive polymer 53. Accordingly, a backbone chain of the conductive polymer 53 may be guided by the polyanions 55 to be generated in an unfolded state, thereby further improving electrical conductivity.

Meanwhile, when the heat source near the first electrode 20 is removed and an external circuit is re-connected as shown in FIG. 1B, the counter cations 57 gathered near the second electrode 80 are scattered into the ionically conductive active layer 50 due to the Soret effect and, at the same time, electrons may move in the opposite direction through an external circuit. In this case, thermovoltage in the opposite direction may be generated through the external circuit, which may charge a metal electrode, a metal oxide electrode, a conductive polymer electrode, a porous carbon electrode, etc. and may be used for work.

As such, the thermoelectric generator according to the present embodiment can charge and/or generate electricity using temperature differences applied thereto. Accordingly, the thermoelectric generator according to the present embodiment may also be referred to as an ionic thermoelectric supercapacitor (ITESC).

FIG. 2 schematically illustrates physical interactions among a polyanion, a conductive polymer, and a polyvalent crosslinking agent.

The conductive polymer 53 may be doped with + due to the anionic groups ($X^-$) of the polyanions 55 and the functional groups ($R^-$) of the polyvalent crosslinking agent 51. —$N^+$— or —$N_2^+$— present in a portion of the backbone, as an example of the backbone doped with + of the conductive polymer 53, may be electrostatically bonded with the anionic groups ($X^-$) of the polyanions 55 and the dissociated functional groups ($R^-$), i.e., a carboxylate group, a sulfonate group, or a phosphate group, of the polyvalent crosslinking agent 51. In addition, NH contained in the backbone of the conductive polymer 53 may form a hydrogen bond with the non-dissociated anionic group and the countercations (XY), i.e., —OH, —$SO_3H$, —$OSO_3H$, —COOH, —$OPO_3H_2$, or —$PO_3H_2$ group of the polyanions 55 or, when the polyanions 55 are represented by Formula 1B, a carbonyl group

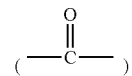

and the non-dissociated functional group (RH), i.e., carboxylic acid, sulfonic acid, or a phosphate group, of the polyvalent crosslinking agent 51. In addition, —$N^+$— or —$N_2^+$— present in a portion of the backbone may form a hydrogen bond with the non-dissociated anionic group and the countercation (XY), i.e., —OH, —$SO_3H$, —$OSO_3H$, —COOH, —$OPO_3H_2$, or —$PO_3H_2$ group of the polyanions 55 and the non-dissociated functional group (RH), i.e., carboxylic acid, sulfonic acid, or a phosphate group, of the polyvalent crosslinking agent 51.

As such, physical interactions or physical bonds, particularly an electrostatic bond and a hydrogen bond, among the polyanions 55, the conductive polymer 53, and the polyvalent crosslinking agent 51 in the ionically conductive active layer 50 may be easily recovered or healed even if the ionically conductive active layer 50 is deformed or damaged. Accordingly, the ionically conductive active layer 50 may exhibit self-healing properties together with elasticity.

As such, the thermoelectric generator according to the present embodiment can charge and/or generate electricity using temperature differences applied thereto. Accordingly, the thermoelectric generator according to the embodiment may also be referred to as an ionic thermoelectric supercapacitor (ITESC). In addition, the thermoelectric generator according to the present embodiment may use an organic material as a thermoelectric active layer, thereby exhibiting flexibility. Further, the thermoelectric generator according to the present embodiment may also exhibit self-healing properties as well as elasticity. Such a thermoelectric generator may be used to realize wearable energy devices, and thus, may be used in a variety of new applications, such as health care monitoring, soft robotics and Internet of Things.

FIG. 3 schematically illustrates physical interactions among PAAMPSA as a polyanion, PANI as a conductive polymer, and PA as a polyvalent crosslinking agent.

Referring to FIG. 3, an electrostatic interaction is present between an amine group of PANI and a sulfonic acid group of PAAMPSA and between an amine group of PANI and a phosphate group of PA. In addition, a hydrogen bond is present between an amine group of PANI and an amide group of PAAMPSA and between an amine group of PANI and a phosphate group of PA. Further, a hydrogen bond is present between an amide group of PAAMPSA and a phosphate group of PA.

FIG. 4 schematically illustrates a thermoelectric generator according to another embodiment of the present disclosure. The thermoelectric generator according to the embodiment is the same as those that have been described reference to with FIGS. 1A and 1B, except for particulars described below.

Referring to FIG. 4, the first and second electrodes 20 and 80 connected to the ionically conductive active layer 50 may be formed to be spaced apart from each other on one side surface, e.g., an upper surface, of the ionically conductive active layer 50. A substrate 10 may be disposed on a lower surface of the ionically conductive active layer 50. However, in some cases, the substrate 10 may be omitted. The spacers 70 may be disposed on at least a portion, which is not covered with the electrodes 20 and 80 or the substrate 10, of the ionically conductive active layer 50.

FIG. 5 schematically illustrates a method of manufacturing an ionically conductive active layer according to an embodiment of the present disclosure.

Referring to FIG. 5, a polyanionic aqueous solution containing the polyanions 55, a polyvalent crosslinking aqueous solution containing the polyvalent crosslinking agent 51, a monomer, and a polymerization initiator are mixed to obtain a mixture. In the mixture, the monomer is polymerized to form a conductive polymer, thereby obtaining a water dispersion containing the conductive polymer 53, the polyanions 55, and the polyvalent crosslinking agent 51.

Here, the monomer is polymerized in an aqueous solution containing the polyanions 55 and the polyvalent crosslinking agent 51 to form the conductive polymer 53. Accordingly, chains of the backbone of the conductive polymer 53 are guided by the polyanions 55, thereby being generated in an unfolded state. Therefore, electrical conductivity may be further improved.

The conductive polymer 53, the polyanions 55, and the polyvalent crosslinking agent 51 have been described above with reference to FIGS. 1A and 1B. The monomer may be varied depending upon the type of the conductive polymer 53 and may be particularly aniline, pyrrole, carbazole, or indole. The polymerization initiator or the oxidizing agent may be ammonium persulfate, potassium persulfate, sodium persulfate, copper chloride, or ferric chloride.

Hereinafter, preferred experimental examples are presented to aid in understanding the present disclosure. However, the following experimental examples are only for aid in understanding of the present disclosure, and the present disclosure is not limited to the following experimental examples.

Electrolyte Dispersion Solution Preparation Example 1: PANI:PAAMPSA:PA (9:68:23, in a Weight Ratio) Dispersion Solution 10 g of PAAMPSA (Sigma Aldrich, 15 wt % in water, MW=2,000,000) an aqueous solution, 0.2 g of aniline (Sigma-Aldrich) and 1.02 g of phytic acid (Sigma-Aldrich, 50 wt % in water) were mixed and cooled at less than 5° C. using an ice bath, thereby obtaining a mixture. At the same time, 0.274 g of ammonium persulphate (APS) was added to 1 ml of deionized water to prepare an aqueous APS solution, followed by cooling at less than 5° C. The mixture was added to the aqueous APS solution, and reaction was allowed to further proceed for 12 hours, thereby obtaining a PANI:PAAMPSA:PA dispersion solution. A weight ratio of PANI:PAAMPSA:PA in the PANI:PAAMPSA:PA dispersion solution was 9:68:23.

Electrolyte Dispersion Solution Preparation Example 2: PANI:PAAMPSA:PA (11:83:6, in a Weight Ratio) Dispersion Solution A PANI:PAAMPSA:PA dispersion solution, in which a weight ratio of PANI:PAAMPSA:PA was 11:83:6, was obtained in the same manner as in Electrolyte Dispersion Solution Preparation Example 1, except that 10 g of an aqueous PAAMPSA solution (Sigma Aldrich, 15 wt % in water, MW=2,000,000), 0.2 g of aniline (Sigma-Aldrich) and 0.22 g of phytic acid (Sigma-Aldrich, 50 wt % in water) were used.

Electrolyte Dispersion Solution Preparation Example 3: PANI:PAAMPSA:PA (7:56:37, in a Weight Ratio) Dispersion Solution A PANI:PAAMPSA:PA dispersion solution, in which a weight ratio of PANI:PAAMPSA:PA was 7:56:37, was obtained in the same manner as in Electrolyte Dispersion Solution Preparation Example 1, except that 10 g of an aqueous PAAMPSA solution (Sigma Aldrich, 15 wt % in water, MW=2,000,000), 0.19 g of aniline (Sigma-Aldrich) and 1.98 g of phytic acid (Sigma-Aldrich, 50 wt % in water) were used.

Electrolyte Dispersion Solution Preparation Example 4: PANI:PAAMPSA:PA (2:75:23, in a Weight Ratio) Dispersion Solution A PANI:PAAMPSA:PA dispersion solution, in which a weight ratio of PANI:PAAMPSA:PA was 2:75:23, was obtained in the same manner as in Electrolyte Dispersion Solution Preparation Example 1, except that 10 g of an aqueous PAAMPSA solution (Sigma Aldrich, 15 wt % in water, MW=2,000,000), 0.04 g of aniline (Sigma-Aldrich) and 0.92 g of phytic acid (Sigma-Aldrich, 50 wt % in water) were used.

Electrolyte Dispersion Solution Preparation Example 5: PANI:PAAMPSA:PA (6:71:23, in a Weight Ratio) Dispersion Solution A PANI:PAAMPSA:PA dispersion solution, in which a weight ratio of PANI:PAAMPSA:PA was 6:71:23, was obtained in the same manner as in Electrolyte Dispersion Solution Preparation Example 1, except that 10 g of an aqueous PAAMPSA solution (Sigma Aldrich, 15 wt % in water, MW=2,000,000), 0.13 g of aniline (Sigma-Aldrich) and 0.97 g of phytic acid (Sigma-Aldrich, 50 wt % in water) were used.

Electrolyte Dispersion Solution Preparation Example 6: PANI:PAAMPSA:PA (18:59:23, in a Weight Ratio) Dispersion Solution A PANI:PAAMPSA:PA dispersion solution, in which a weight ratio of PANI:PAAMPSA:PA was 18:59:23, was obtained in the same manner as in Electrolyte Dispersion Solution Preparation Example 1, except that 10 g of an aqueous PAAMPSA solution (Sigma Aldrich, 15 wt % in water, MW=2,000,000), 0.46 g of aniline (Sigma-Aldrich) and 1.17 g of phytic acid (Sigma-Aldrich, 50 wt % in water) were used.

Electrolyte Dispersion Solution Comparative Example 1: PANI:PAAMPSA Dispersion Solution A PANI:PAAMPSA dispersion solution, in which a weight ratio of PANI:PAAMPSA was 9:68, was prepared in substantially the same manner as in Electrolyte Dispersion Solution Preparation Example 1, except that PA was not added.

Electrolyte Dispersion Solution Comparative Example 2: PAAMPSA Dispersion Solution A PAAMPSA dispersion solution (15 wt % in water) was used in Electrolyte Dispersion Solution Comparative Example 2.

Electrolyte Dispersion Solution Comparative Example 3: PAAMPSA:PA (77:23, in a Weight Ratio) Dispersion Solution 10 g of PAAMPSA (Sigma Aldrich, 15 wt % in water, MW=2,000,000) an aqueous solution and 0.90 g of phytic acid (Sigma-Aldrich, 50 wt % in water) were mixed to obtain a PAAMPSA:PA dispersion solution. A weight ratio of PAAMPSA:PA was 77:23 in the obtained PAAMPSA:PA dispersion solution.

FIG. 6 illustrates a UV-vis spectrum of a dispersion solution prepared according to Electrolyte Dispersion Solution Preparation Example 1.

Referring to FIG. 6, a broad peak at ~820 nm and a peak at 420 nm are exhibited due to the polaron band, which indicates that PANI has a conductive emeraldine salt form.

Meanwhile, the dispersion solution obtained in Electrolyte Dispersion Solution Preparation Example 1 is also green because PANI is a conductive emeraldine salt form.

Electrolyte Membrane Manufacturing Examples 1 to 6: PANI:PAAMPSA:PA Electrolyte Membrane A PANI:PAAMPSA:PA dispersion solution prepared according to any one of Electrolyte Dispersion Solution Preparation Examples 1 to 6 was drop-casted on a pre-cleaned 3M substrate (3M VHB-4910 tape), followed by spin-coating, thereby manufacturing an electrolyte membrane. The thickness of the electrolyte membrane was controlled by a spin-coating rate. Next, the electrolyte membrane was heated and dried on a hot plate at 60° C. for 5 minutes. Next, the electrolyte membrane was separated from the substrate, thereby forming a freestanding film.

Electrolyte Membrane Comparative Examples 1 to 3

Electrolyte membranes were manufactured in substantially the same manner as in Electrolyte Membrane Preparation Example 1, except that an electrolyte membrane was manufactured using a dispersion solution according to any one of Electrolyte Dispersion Solution Comparative Examples 1 to 3 instead of the dispersion solution according to Electrolyte Dispersion Solution Preparation Example 1.

The following Table 1 shows compositions of nitrogen-containing functional groups and sulfur-containing functional groups in electrolyte membranes manufactured according to Electrolyte Membrane Preparation Example 1, Electrolyte Membrane Comparative Example 1, and Electrolyte Membrane Comparative Example 2. The compositions are calculated from the areas of deconvoluted nitrogen (N 1s) and sulfur (S 2p) peaks obtained from spectra of the electrolyte membranes using high-resolution X-ray Photoelectron Spectroscopy (XPS).

TABLE 1

|  |  | N 1s | | | S 2p | |
| --- | --- | --- | --- | --- | --- | --- |
|  |  | —NH— (%) | —N$^+$— (%) | —N$_2^+$— (%) | —SO$_3^-$ (%) | —SO$_3$H (%) |
| Electrolyte Membrane Preparation Example 1 | PANI:PAAMPSA:PA | 22.6 | 15.1 | 62.3 | 25.8 | 74.2 |
| Electrolyte Membrane Comparative Example 1 | PANI:PAAMPSA | 26.0 | 26.5 | 47.5 | 48.5 | 51.5 |
| Electrolyte Membrane Comparative Example 2 | PAAMPSA | — | — | — | 75.0 | 25.0 |

Referring to Table 1, it can be confirmed that, in the case of PANI:PAAMPSA:PA, sulfur is present in the form of SO$_3$H group in a significantly high ratio, compared to PAAMPSA and PANI:PAAMPSA. This is estimated as occurring because six —PO$_3$H$_2$ groups (pKa=1.5) of PA have a higher dissociation constant than a —SO$_3$H group (pKa=2.29) of PAAMPSA, and thus, sulfur of PAAMPSA is present in the form of a SO$_3$H group rather than a SO$_3^-$ group. In this case, the concentration of protons in the electrolyte membrane increases, and the ionic Soret effect is improved, so that the thermoelectric effect may be improved.

In addition, in the case of PANI:PAAMPSA:PA, a ratio of nitrogen present in the form of —$N_2^+$— increases, compared to PANI:PAAMPSA. This is interpreted as occurring because PA performs improved electrostatic interaction, i.e., physical crosslinking, with a protonated amine group of PANI. Accordingly, self-healing properties may be improved.

As such, due to addition of PA, self-healing properties may be improved together with improvement of thermoelectric effect.

FIGS. 7A to 7D illustrates a photograph (a), a stress-strain curve (b), tensile property test photographs (c), and self-healing property test photographs (d) of an electrolyte membrane prepared according to Electrolyte Membrane Preparation Example 1.

Referring to FIGS. 7A to 7D, it can be confirmed that an electrolyte membrane manufactured according to Electrolyte Membrane Preparation Example 1 has a thickness of about 0.01 to 1 mm, remarkable flexibility under ambient conditions (a) and elasticity (c). After storing the electrolyte membrane for 30 minutes in a chamber, the humidity of which was controlled in a range of 30%, 40%, 60%, and 80%, a strain degree of the electrolyte membrane was examined while applying tensile stress to the electrolyte membrane. The electrolyte membrane became softer and more flexible with increasing RH. Particularly, a maximum strain rate increased from 100% to 750% when RH increased from 30% to 80% (b), whereas the Young's modulus decreased from 1106 KPa to 11 kPa. Such humidity dependence is assumed as occurring because an electrostatic interaction between PANI and PAAMPSA, an electrostatic interaction between PANI and PA, a hydrogen-bonding interaction between PANI and PAAMPSA, and a hydrogen-bonding interaction between PANI and PA are further activated due to water adsorption. Mechanical properties of the membranes under various RH conditions are summarized in Table 2 below. In addition, it can be confirmed that, when separated pieces were brought into contact with each other at room temperature under atmospheric pressure after cutting the membrane with scissors, the separated pieces were self-healed and re-connected, i.e., self-recovered, without external stimuli such as external force, light, and heat. It can be confirmed that this self-healed membrane is not broken even if stretched up to 300% (d). Further, the membrane still showed excellent flexibility and self-healing ability even after repeating cutting and healing several times.

TABLE 2

| Relative Humidity (% RH) | 30 | 40 | 60 | 80 |
|---|---|---|---|---|
| Young's Moduli (kPa) | 1106 | 178 | 38 | 11 |
| Strength (kPa) | 2.85 | 0.55 | 0.42 | 0.35 |
| Toughness (kJ/m$^3$) | 235 | 138 | 161 | 157 |

FIG. 8 illustrates stress-strain curves of electrolyte membranes according to Electrolyte Membrane Preparation Example 1, Electrolyte Membrane Comparative Example 1, and Electrolyte Membrane Comparative Example 3.

Referring to FIG. 8, each of the electrolyte membrane was stored for 30 minutes in a chamber, the humidity of which was adjusted to 40%, and then a strain degree of the electrolyte membrane while applying tensile stress thereto was examined. As a result, it can be confirmed that a maximum strain rate of the electrolyte membrane (PANT: PAAMPSA:PA) according to Electrolyte Membrane Preparation Example 1 increases, compared to Electrolyte Membrane Comparative Example 1 (PANT:PAAMPSA) and Electrolyte Membrane Comparative Example 3 (PAAMPSA:PA), thereby having greater elasticity.

FIG. 9 illustrates self-healing properties of electrolyte membranes according to Electrolyte Membrane Comparative Example 1 and Electrolyte Membrane Comparative Example 3.

Referring to FIG. 9, it can be confirmed that, when the electrolyte membranes according to Electrolyte Membrane Comparative Example 1 (PANI:PAAMPSA) and Electrolyte Membrane Comparative Example 3 (PAAMPSA:PA) were cut with scissors, and then separated pieces were brought into contact with each other at room temperature under atmospheric pressure, the separated pieces were not self-healed and thus were not re-connected, which indicates that the electrolyte membranes do not have self-healing ability.

As such, it can be confirmed that the electrolyte membranes according to Electrolyte Membrane Comparative Example 1 (PANI:PAAMPSA) and Electrolyte Membrane Comparative Example 3 (PAAMPSA:PA) have poor elasticity and do not have self-resilience.

From the results, it can be confirmed that the elasticity and self-resilience of the electrolyte membrane according to the present embodiment are inherent characteristics exhibited when all PANI, PAAMPSA, and PA are contained. Particularly, the membrane is interpreted as being capable of exhibiting elasticity and self-resilience due to the hydrogen bond between the amide group of PAAMPSA and the phosphate group of PA in addition to the electrostatic interaction between the amine group of PANI and the sulfonic acid group of PAAMPSA, the electrostatic interaction between the amine group of PANI and the phosphate group of PA, the hydrogen bond between the amine group of PANI and the amide group of PAAMPSA, and the hydrogen bond between the amine group of PANI and the phosphate group of PA.

Thermoelectric Generator Manufacturing Example 1

A pair of silver electrode patterns were formed on a polyethylene terephthalate (PET) substrate using a thermal evaporation method. Here, the electrode patterns had a thickness of 100 nm and a width of 3 mm, and a distance between the electrodes was 8 mm. The PET substrate, on which the electrode patterns had been formed, was pre-treated with UV/ozone for 5 minutes to generate a hydrophilic surface. A PANI:PAAMPSA:PA dispersion solution prepared according to Electrolyte Dispersion Solution Preparation Example 1 was coated on the PET substrate, on which the electrode patterns had been formed, using a doctor-blade method, followed by heating at 60° C. for 5 minutes, thereby forming an electrolyte membrane having a thickness of about ~10 μm.

Thermoelectric Generator Manufacturing Example 2

A thermoelectric generator was manufactured in substantially the same manner as in Thermoelectric Generator Manufacturing Example 1, except that an electrolyte dispersion solution according to Electrolyte Dispersion Solution Preparation Example 2 was used instead of an electrolyte dispersion solution according to Electrolyte Dispersion Solution Preparation Example 1.

Thermoelectric Generator Manufacturing Example 3

A thermoelectric generator was manufactured in substantially the same manner as in Thermoelectric Generator Manufacturing Example 1, except that an electrolyte dispersion solution according to Electrolyte Dispersion Solution Preparation Example 3 was used instead of an electrolyte dispersion solution according to Electrolyte Dispersion Solution Preparation Example 1.

Thermoelectric Generator Manufacturing Example 4

A thermoelectric generator was manufactured in substantially the same manner as in Thermoelectric Generator Manufacturing Example 1, except that an electrolyte dispersion solution according to Electrolyte Dispersion Solution Preparation Example 4 was used instead of an electrolyte dispersion solution according to Electrolyte Dispersion Solution Preparation Example 1.

Thermoelectric Generator Manufacturing Example 5

A thermoelectric generator was manufactured in substantially the same manner as in Thermoelectric Generator Manufacturing Example 1, except that an electrolyte dispersion solution according to Electrolyte Dispersion Solution Preparation Example 5 was used instead of an electrolyte dispersion solution according to Electrolyte Dispersion Solution Preparation Example 1.

Thermoelectric Generator Manufacturing Example 6

A thermoelectric generator was manufactured in substantially the same manner as in Thermoelectric Generator Manufacturing Example 1, except that an electrolyte dispersion solution according to Electrolyte Dispersion Solution Preparation Example 6 was used instead of an electrolyte dispersion solution according to Electrolyte Dispersion Solution Preparation Example 1.

Thermoelectric Generator Comparative Example 1

A thermoelectric generator was manufactured in substantially the same manner as in Thermoelectric Generator Manufacturing Example 1, except that an electrolyte dispersion solution according to Thermoelectric Generator Comparative Example 1 was used instead of an electrolyte dispersion solution according to Electrolyte Dispersion Solution Preparation Example 1.

Thermoelectric Generator Comparative Example 2

A thermoelectric generator was manufactured in substantially the same manner as in Thermoelectric Generator Manufacturing Example 1, except that an electrolyte dispersion solution according to Thermoelectric Generator Comparative Example 2 was used instead of an electrolyte dispersion solution according to Electrolyte Dispersion Solution Preparation Example 1.

Thermoelectric Generator Comparative Example 3

A thermoelectric generator was manufactured in substantially the same manner as in Thermoelectric Generator Manufacturing Example 1, except that an electrolyte dispersion solution according to Thermoelectric Generator Comparative Example 3 was used instead of an electrolyte dispersion solution according to Electrolyte Dispersion Solution Preparation Example 1.

Thermoelectric Generator Property Measurement

FIG. 10 schematically illustrates the thermoelectric power generation principle of a thermoelectric generator manufactured according to Thermoelectric Generator Manufacturing Example 1, and FIGS. 11A to 11C illustrates graphs (a) showing thermovoltages dependent upon temperature differences applied to a thermoelectric generator manufactured according to Thermoelectric Generator Manufacturing Example 1, graph (b) showing Seebeck coefficients, electrical conductivity, and power factors dependent upon relative humidity of the thermoelectric generator, and graphs (c) showing thermal conductivity and ZT dependent upon a relative humidity of the thermoelectric generator. Here, all measurements were performed at room temperature.

The following Table 3 shows Seebeck coefficients, electrical conductivity, power factors, thermal conductivity, and ZT values of the thermoelectric generators. To apply a temperature difference to the thermoelectric generators, two Peltier elements were used.

TABLE 3

| Relative humidity | Seebeck co-efficient (mV K$^{-1}$) | Electrical conductivity ($\times 10^{-2}$ Scm$^{-1}$) | Power factor ($\times 10^{-2}$ mWm$^{-1}$K$^{-2}$) | Thermal conductivity (W m$^{-1}$ K$^{-1}$) | ZT ($\times 10^{-3}$) |
|---|---|---|---|---|---|
| 50 | 1.3 | 1.39 | 0.25 | 0.36 | 2.06 |
| 60 | 2.4 | 2.67 | 1.6 | 0.38 | 12.5 |
| 70 | 3.9 | 4.23 | 6.3 | 0.39 | 47.8 |
| 80 | 5.4 | 14.2 | 41 | 0.42 | 294 |
| 90 | 8.1 | 25.6 | 170 | 0.44 | 1150 |

Referring to FIG. 10, when a temperature difference is applied to the thermoelectric generator, thermal diffusion occurs while hydrogen ions hop between sulfonic acid groups of PAAMPSA from a high-temperature region to a low-temperature region, so that a concentration difference of hydrogen ions occurs in the electrolyte film (Soret effect) and a potential difference, i.e., open-circuit voltage, occurs between the electrodes of the thermoelectric generator.

Referring to FIGS. 11A to 11C and Table 3, the slope, i.e., the Seebeck coefficient, of thermovoltage dependent upon a temperature difference at an ambient humidity of 50% RH is 1.3 mV K$^{-1}$, which is 125 times larger than the Seebeck coefficient, $1 \times 10^{-2}$ mV K$^{-1}$, a PANI-based thermoelectric material reported based on the Seebeck effect caused by diffusion of holes. This indicates that thermopower of the PANI:PAAMPSA:PA hybrid electrolyte membrane is dominated by the Soret effect rather than the Seebeck effect (a).

Meanwhile, the Seebeck coefficient (S), electrical conductivity ($\sigma$), and the power factor increase with increasing RH. This is estimated as occurring because more protons are decomposed from PAAMPSA and PA and, accordingly, thermally diffuse (b). Particularly, electrical conductivity ($\sigma$) is an important parameter that determines power factor ($S^2\sigma$) and ZT ($S^2\sigma T/k$, where T is an absolute temperature and k is thermal conductivity) and is determined by diffusion, i.e., ionic conductivity, of protons through PAAMPSA, and electron conductivity occurring in hole transport through PANI. In 50% RH, the PANI:PAAMPSA:PA hybrid electrolyte membrane has an electrical conductivity of 1.39× $10^{-2}$ Scm$^{-1}$, and increases 18 times (2.56×10$^{-1}$ Scm$^{-1}$) in 90% RH. As such, the high humidity dependence of electrical conductivity indicates that the electrical conductivity of the PANI:PAAMPSA:PA hybrid electrolyte membrane is dominated by ionic conductivity.

In addition, the thermal conductivity (k) and ZT increase with increasing RH (c).

FIGS. 12A to 12C illustrates graphs (b) of thermovoltages when a thermoelectric generator (a) manufactured according to Thermoelectric Generator Manufacturing Example 1 in a non-deformed state or in a 50%-stretched state is temperature-changed in a temperature difference range of 4 K, and a thermovoltage graph (c) when a temperature difference of 6 K is applied the thermoelectric generator while repeatedly 50%-stretching the thermoelectric generator a total of 30 cycles.

Referring to FIGS. 12A to 12C, it can be confirmed that, in the thermoelectric generator (a) obtained according to Thermoelectric Generator Manufacturing Example 1, a thermovoltage difference is 29.2 mV at a temperature difference of ±2K when 50% strained, and a thermovoltage difference at a temperature difference of ±2K when non-strained is 27.9 mV which is similar to the thermovoltage difference when 50% strained. This indicates that the thermoelectric generator (a) obtained according to Thermoelectric Generator Manufacturing Example 1 may maintain thermoelectric properties thereof even under severe deformation such as 50% strain (b). In addition, when a temperature difference of 6 K is applied while repeatedly 50%-stretching the thermoelectric generator a total of 30 cycles, a thermovoltage after the stretching test of 30 cycles is 41 mV which is not greatly different from the thermovoltage, 43 mV, before the stretching test. This indicates that the thermoelectric generator obtained according to Thermoelectric Generator Manufacturing Example 1 has excellent durability.

stimuli such as force, light, or heat (b). In addition, it can be confirmed that, when self-healing according to cutting and re-connection is repeatedly performed 3 times under an RH condition of 70%, there is little change in resistance (c), and, when analyzed using Electrochemical Impedance Spectroscopy (EIS), the semicircle of the Nyquist plot is not greatly changed (d) even if cutting and self-healing are repeated 3 times. This indicates that there is no substantial change in electronic properties of the active layer of the thermoelectric generator during the self-healing process. In the pristine, primary, secondary and tertiary cutting and self-healing cycles, the electrical conductances were 1.23, 1.37, 1.33 and 1.32 mS, respectively (d) (d). In addition, even if cutting-healing was repeated 3 times while periodically changing a temperature difference at 70% RH, there was no great change in a thermovoltage (e), and there was no significant deterioration in both thermovoltage and electrical conductivity even after the active layer was cut and healed a total of 30 cycles at RH of 90% (f). From these results, it can be confirmed that the original mechanical, electrical, and thermoelectric characteristics of the electrolyte membrane according to an embodiment of the present disclosure are hardly changed during repeated cutting and self-healing processes.

FIG. 14 illustrates Seebeck coefficients, electrical conductivity, and power factors of thermoelectric generators manufactured according to Thermoelectric Generator Manufacturing Examples 1 to 3 when a relative humidity is 90%. FIG. 15 illustrates Seebeck coefficients of thermoelectric generators manufactured according to Thermoelectric Generator Manufacturing Examples 1 and 4 to 6 when a relative humidity is 90%.

In addition, Table 4 particularly shows the Seebeck coefficients, electrical conductivity, and power factors of the thermoelectric generators according to Thermoelectric Generator Manufacturing Examples 1 to 6 and Thermoelectric Generator Comparative Examples 2 and 3 when a relative humidity is 90%.

TABLE 4

| | | Seebeck coefficient (mV K$^{-1}$) | Electrical conductivity (Scm$^{-1}$) | Power factor (mWm$^{-1}$K$^{-2}$) |
|---|---|---|---|---|
| Comparative Example 2 | PAAMPSA | 5.7 | — | — |
| Comparative Example 3 | PAAMPSA:PA | 8.4 | — | — |
| Manufacturing Example 2 | PANI(11 wt %):PAAMPSA(83 wt %):PA(6 wt %) | 7.8 | 0.21 | 1.3 |
| Manufacturing Example 1 | PANI(9 wt %):PAAMPSA(68 wt %):PA(23 wt %) | 8.1 | 0.26 | 1.7 |
| Manufacturing Example 3 | PANI(7 wt %):PAAMPSA(56 wt %):PA(37 wt %) | 8.2 | 0.27 | 1.8 |
| Manufacturing Example 4 | PANI(2 wt %):PAAMPSA(75 wt %):PA(23 wt %) | 9.1 | — | — |
| Manufacturing Example 5 | PANI(6 wt %):PAAMPSA(71 wt %):PA(23 wt %) | 9.4 | — | — |
| Manufacturing Example 6 | PANI(18 wt %):PAAMPSA(59 wt %):PA(23 wt %) | 5.4 | — | — |

FIGS. 13A to 13F illustrates self-healing properties of a thermoelectric generator of manufactured according to Thermoelectric Generator Manufacturing Example 1.

Referring to FIGS. 13A to 13F, it can be confirmed that the thermoelectric generator obtained according to Thermoelectric Generator Manufacturing Example 1 is physically cut using scissors, and the separated parts are re-connected, electric conduction is recovered without applying external Referring to FIG. 14 and Table 4, the S value (Seebeck coefficient) of the PANI:PAAMPSA:PA hybrid electrolyte membrane is much higher than that of the single PAAMPSA electrolyte membrane. Such a high S value is estimated as being caused by increased concentration of mobile protons due to combination of PAAMPSA and PA in the PANI:PAAMPSA:PA hybrid electrolyte membrane.

Meanwhile, the S value, the electrical conductivity, and the power factor were observed as increasing as the content of PA in the PANI:PAAMPSA:PA hybrid electrolyte membrane increases, but, when the content of PA reached about 23 wt % (34 parts by weight of PA based on 100 parts by weight of PAAMPSA), an increase in the S value, electrical conductivity, and power factor was confirmed as being saturated.

Referring to FIG. 15 and Table 4, it can be confirmed that, when the content of PANI is about 2 to 9 wt % (3 to 13 parts by weight of PANI based on 100 parts by weight of PAAMPSA), particularly, about 2 to 6 wt % (3 to 8 parts by weight of PANI based on 100 parts by weight of PAAMPSA), in the PANI:PAAMPSA:PA hybrid electrolyte membrane, excellent S value is exhibited.

In accordance with embodiments of the present disclosure, a thermoelectric material exhibiting excellent thermoelectric characteristics while having flexibility, and a thermoelectric generator including the thermoelectric material can be provided. In addition, a thermoelectric material having excellent elasticity and self-healing properties and a thermoelectric generator including the thermoelectric material can be provided.

The effect of the present disclosure is not limited to the effects mentioned above, and other effects of the disclosure can be clearly understood from the appended claims.

Although the present disclosure has been described in detail with reference to the preferred embodiments, those skilled in the art will appreciate that the scope of the present disclosure is not limited to the embodiments and various modifications and changes are possible within the technical spirit and scope of the present disclosure.

What is claimed is:

1. A thermoelectric generator; comprising:
an ionically conductive active layer containing a polyanion comprising an anionic group and a counter cation in a repeat unit thereof, a conductive polymer, wherein the conductive polymer is a conductive polymer having an amine group in a backbone thereof; and a polyvalent crosslinking agent as a single molecule comprising a plurality of acid functional groups or basic functional groups; and
first and second electrodes connected to the ionically conductive active layer.

2. The thermoelectric generator according to claim 1, wherein the ionically conductive active layer is a gel containing a liquid.

3. The thermoelectric generator according to claim 1, wherein a dissociation constant of the polyvalent crosslinking agent having acid functional groups is larger than a dissociation constant of the polyanion.

4. The thermoelectric generator according to claim 1, wherein the polyanion, the conductive polymer, and the polyvalent crosslinking agent are crosslinked by a hydrogen bond and an electrostatic bond.

5. The thermoelectric generator according to claim 1, wherein an anionic group of the polyanion is —O$^-$, —SO$^{3-}$, —OSO$_3^-$, —COO$^-$, —OPO$_3^{2-}$, or —PO$_3^{2-}$, and a counter cation thereof is H$^+$, Li$^+$, K$^+$, or Na$^+$.

6. The thermoelectric generator according to claim 1, wherein a repeat unit of the polyanion is represented by Formula 1A below:

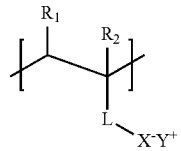

[Formula 1A]

wherein R$_1$ and R$_2$ are each independently a hydrogen or a methyl group,

L is a functional group comprising a bond, —CONH—, —COO—, or phenylene,

X$^-$ is —O$^-$, —SO$_3^-$, —OSO$_3^-$, —COO$^-$, —OPO$_3^{2-}$, or —PO$_3^{2-}$, and Y$^+$ is H$^+$, Li$^+$, K$^+$, or Na$^+$.

7. The thermoelectric generator according to claim 6, wherein the repeat unit of the polyanion of Formula 1A is represented by Formula 1B below:

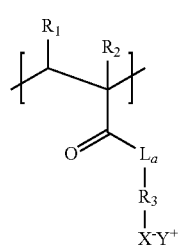

[Formula 1B]

wherein L$_a$ is O or NH,

R$_3$ is a C1 to C6 substituted or unsubstituted alkylene group, and

R$_1$, R$_2$, X$^-$, and Y$^+$ are each the same as those defined in Formula 1A.

8. The thermoelectric generator according to claim 1, wherein the polyanion is poly(2-acrylamido-2-methyl-1-propanesulfoinc acid) (PAAMPSA).

9. The thermoelectric generator according to claim 1, wherein the conductive polymer is a polymer having an amine group (—NH—) in the backbone represented by Formula 2A or a polyaniline-based polymer having a repeat unit represented by Formula 2B:

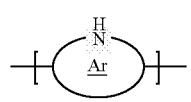

[Formula 2A]

wherein Ar is 5- to 13-membered aromatic ring including N,

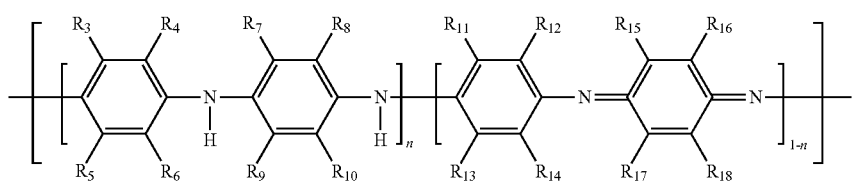

wherein n is 0 to 1, and $R_3$ to $R_{18}$ are each independently hydrogen, C1 to C6 alkyl, C1 to C6 alkoxy, C1 to C6 haloalkyl, C1 to C6 haloalkoxy, F, Cl, Br, I, or CN, or $R_3$ and $R_4$, $R_5$ and $R_6$, $R_7$ and $R_8$, $R_9$ and $R_{10}$, $R_{11}$ and $R_{12}$, $R_{13}$ and $R_{14}$, $R_{15}$ and $R_{16}$, or $R_{17}$ and $R_{18}$ form an aromatic ring fused to a benzene ring to which $R_3$ to $R_{18}$ are attached.

10. The thermoelectric generator according to claim 1, wherein the polyvalent crosslinking agent comprises 3 to 6 acid functional groups or basic functional groups, and
the functional group is carboxylic acid, sulfonic acid, phosphoric acid, or an amine group.

11. The thermoelectric generator according to claim 10, wherein the polyvalent crosslinking agent is represented by Formula 3 below:

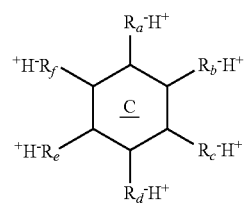

[Formula 3]

wherein ring C is a benzene ring, cyclohexane, or cyclohexene, and $R_a$, $R_b$, $R_c$, $R_d$, $R_e$, and $R_f$ are each independently, hydrogen, carboxylic acid, sulfonic acid, or a phosphate group, and at least three of $R_a$, $R_b$, $R_c$, $R_d$, $R_e$, and $R_f$ are each independently carboxylic acid, sulfonic acid, or a phosphate group.

12. The thermoelectric generator according to claim 1, wherein the polyvalent crosslinking agent is phytic acid (PA).

13. The thermoelectric generator according to claim 1, wherein the ionically conductive active layer comprises 100 parts by weight of the polyanion, about 1 to 50 parts by weight of the conductive polymer, and about 1 to 80 parts by weight of the polyvalent crosslinking agent.

14. The thermoelectric generator according to claim 1, wherein at least one of the electrodes is a metal oxide, a conductive polymer or porous carbon.

15. A thermoelectric material, comprising an ionically conductive active layer containing a polyanion comprising an anionic group and a counter cation in a repeat unit thereof, a conductive polymer comprising an amine group in a backbone thereof, and a polyvalent crosslinking agent as a single molecule having a plurality of acid functional groups,
wherein the polyanion, the conductive polymer, and the polyvalent crosslinking agent are crosslinked by a hydrogen bond and an electrostatic bond.

* * * * *